(12) United States Patent
Ofuji et al.

(10) Patent No.: US 8,530,246 B2
(45) Date of Patent: Sep. 10, 2013

(54) METHOD FOR CONTROLLING THRESHOLD VOLTAGE OF SEMICONDUCTOR ELEMENT

(75) Inventors: Masato Ofuji, Honjo (JP); Yasuyoshi Takai, Kawasaki (JP); Takehiko Kawasaki, Kamakura (JP); Norio Kaneko, Atsugi (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 12/992,073

(22) PCT Filed: May 11, 2009

(86) PCT No.: PCT/JP2009/059103
§ 371 (c)(1),
(2), (4) Date: Nov. 10, 2010

(87) PCT Pub. No.: WO2009/139482
PCT Pub. Date: Nov. 19, 2009

(65) Prior Publication Data
US 2011/0076790 A1 Mar. 31, 2011

(30) Foreign Application Priority Data
May 12, 2008 (JP) ................. 2008-124859

(51) Int. Cl.
*H01L 21/00* (2006.01)
*H01L 21/336* (2006.01)
*H01L 21/331* (2006.01)
*G01R 31/26* (2006.01)

(52) U.S. Cl.
USPC ............... 438/4; 438/17; 438/30; 438/197; 438/308; 438/378

(58) Field of Classification Search
USPC ............ 438/4, 17, 30, 197, 308, 378
See application file for complete search history.

(56) References Cited

U.S. PATENT DOCUMENTS
5,012,314 A * 4/1991 Tobita et al. ............. 250/205
5,079,606 A 1/1992 Yamamura
(Continued)

FOREIGN PATENT DOCUMENTS
JP 9-213965 A 8/1997
JP 10-209460 A 8/1998
(Continued)

OTHER PUBLICATIONS
Barquinha et al., J. Non-Cryst. Sol., Amsterdam, NL, vol. 352, No. 1756 (2006), XP025187662.
(Continued)

*Primary Examiner* — Charles Garber
*Assistant Examiner* — Ron Pompey
(74) *Attorney, Agent, or Firm* — Canon U.S.A., Inc. IP Division

(57) ABSTRACT

A method for controlling the threshold voltage of a semiconductor element having at least a semiconductor as a component is characterized in including a process to measure one of a threshold voltage and a characteristic value serving as an index for the threshold voltage; a process to determine one of the irradiation intensity, irradiation time, and wavelength of the light for irradiating the semiconductor based on one of the measured threshold voltage and the measured characteristic value serving as the index for the threshold voltage; and a process to irradiate light whose one of the irradiation intensity, irradiation time, and wavelength has been determined onto the semiconductor; wherein the light irradiating the semiconductor is a light having a longer wavelength than the wavelength of the absorption edge of the semiconductor, and the threshold voltage is changed by the irradiation of the light.

4 Claims, 14 Drawing Sheets

(56) References Cited

U.S. PATENT DOCUMENTS

| | | |
|---|---|---|
| 5,648,665 A | 7/1997 | Terasawa |
| 5,811,328 A | 9/1998 | Zhang et al. |
| 6,051,857 A | 4/2000 | Miida |
| 6,124,155 A | 9/2000 | Zhang et al. |
| 6,166,399 A | 12/2000 | Zhang et al. |
| 6,635,521 B2 | 10/2003 | Zhang et al. |
| 7,145,174 B2 | 12/2006 | Chiang et al. |
| 7,189,992 B2 | 3/2007 | Wager, III et al. |
| 7,242,039 B2 | 7/2007 | Hoffman et al. |
| 7,282,782 B2 | 10/2007 | Hoffman et al. |
| 7,297,977 B2 | 11/2007 | Hoffman et al. |
| 8,084,331 B2 * | 12/2011 | Ofuji et al. .................... 438/378 |
| 2005/0173386 A1 * | 8/2005 | Kanazaki et al. ........ 219/121.62 |
| 2007/0194379 A1 | 8/2007 | Hosono et al. |

FOREIGN PATENT DOCUMENTS

| | | |
|---|---|---|
| JP | 2000-208776 A | 7/2000 |
| JP | 2002-299629 A | 10/2002 |
| JP | 2005-044878 A | 2/2005 |

OTHER PUBLICATIONS

Yabuta et al., Appl. Phys. Lett., 89, 112123 (2006).
T. Riedl, et al, Phys. Stat. Sol., 1, 175 (2007).
Kim et al., International Electron Device Meeting 2006 (IEDM'06), 11-13, 1 (2006).
P. Gorrn, et al., XP002528977, Applied Physics Letters 91, 193504 (2007).
P. Gorrn, et al., XP012095982, Applied Physics Letters 90, 063502 (2007).

* cited by examiner

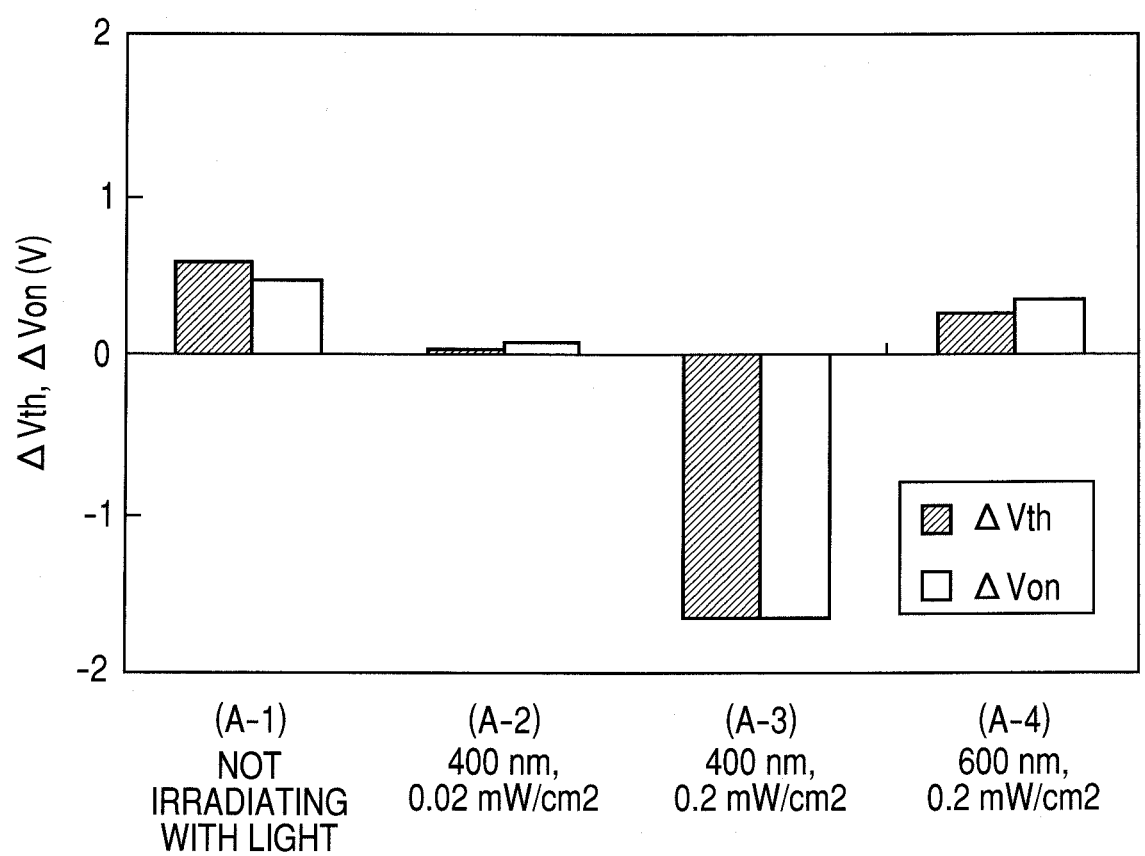

|  |  |  | $V_{th}$ (V) | $\mu_{sat}$ ($cm^2V^{-1}s^{-1}$) | S ($Vdec^{-1}$) |
|---|---|---|---|---|---|
| (1-1) | DESIGNED VALUE |  | 5 ±0.2 | 12.0 ±1.0 | 0.60 ±0.05 |
| (1-2) | MEASURED VALUE | BEFORE IRRADIATING WITH LIGHT | 6.0 | 12.5 | 0.57 |
| (1-3) | MEASURED VALUE | AFTER IRRADIATING WITH LIGHT (WAVELENGTH 395 nm, 0.2 mW cm$^{-2}$) | 5.0 | 12.3 | 0.59 |

FIG. 25C
OUTPUT OF
S/H CIRCUIT
FIG. 25D
BRIGHTNESS OF
LIGHT EMITTING
CIRCUIT
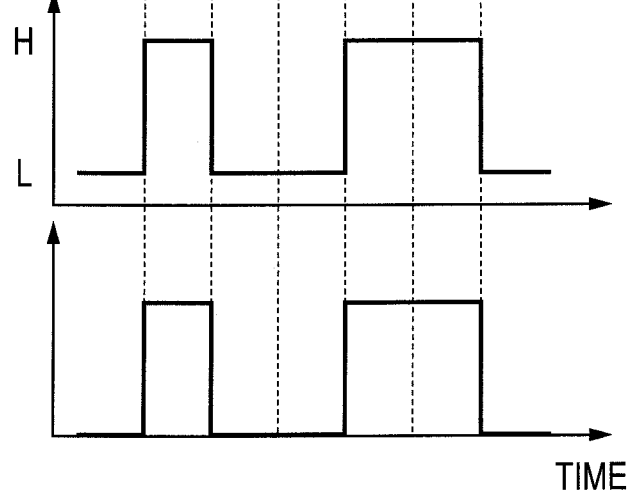
TIME
FIG. 26
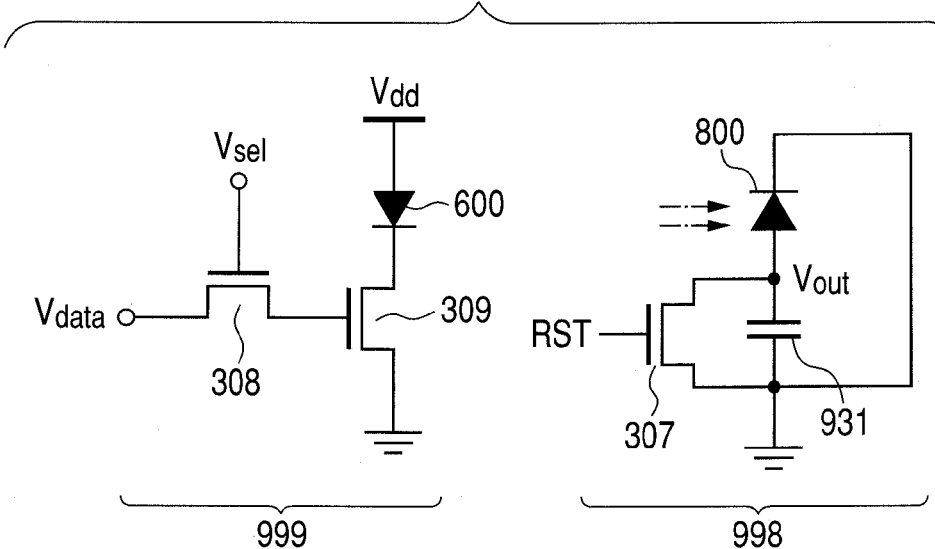

METHOD FOR CONTROLLING THRESHOLD VOLTAGE OF SEMICONDUCTOR ELEMENT

TECHNICAL FIELD

The present invention relates to a method for controlling the threshold voltage of a semiconductor element using semiconductors.

BACKGROUND ART

A TFT back plane is a device wherein a plurality of thin film transistors (TFT) is arrayed on a substrate. Presently, an active matrix liquid crystal display and an active matrix organic electroluminescent display (organic EL display, organic light emitting diode display) using the TFT back plane are actively studied and developed. As the TFT, a hydrogenated amorphous silicon (a-Si:H) TFT and a low-temperature polycrystalline silicon (LTPS) TFT have been used.

In such a TFT back plane, the improvement of threshold voltage stability and the improvement of in-plane uniformity are critical issues. For threshold voltage stability, the suppression of change in the threshold voltage of the TFT caused by various reasons (change with time, electrical stress, and thermal stress) is a critical issue. On the other hand, for the in-plane uniformity of the transistor array, the suppression of threshold voltage fluctuation between elements caused by the non-uniformity of fabricating processes and material structures is a critical issue.

The stability of threshold voltage will be further described exemplifying an a-Si:H TFT, which is an n-channel TFT. When a positive gate-source voltage (Vgs) is supplied to the a-Si:H TFT, electrical stress is caused, and the threshold voltage elevates. When a negative Vgs is supplied, the threshold voltage lowers. When the threshold voltage is varied by causes, such as electrical stress, and exceeds the control power voltage range of Vgs, the TFT does not operate. This time can be considered to be one definition of lifetime of the TFT.

Next, the in-plane uniformity of the transistor array will be further described exemplifying an LIPS TFT array. Since the material of the channel layer is a thin polycrystalline film, if a plurality of LIPS TFT is fabricated on the same substrate, the density of an electrically active defect in the channel layer of each TFT is different from one another. As a result, the fluctuation of threshold voltages is caused between TFTs. Also when in-plane non-uniformity is present in the crystallizing process of the channel layer, the fluctuation between elements is caused. If such fluctuation of the threshold voltage is present in the TFT back plane, the display uniformity and the gray level of the display is impaired.

As a new TFT that can solve such issues, a TFT using an oxide semiconductor in the channel layer recently attracts attentions. For example, a method for fabricating TFT using a thin film of amorphous In—Ga—Zn—O (IGZO) formed by an RF sputtering method as the channel layer is disclosed in Yabuta et al., Appl. Phys. Lett., 89, 112123 (2006).

Also in an oxide TFT, changes in the threshold voltage due to one of electrical stress and the combination of electrical stress and thermal stress has been observed. Such changes are disclosed in Riedl et al, Phys. Stat. Sol., 1, 175 (2007) and Kim et al., International Electron Device Meeting 2006 (IEDM'06), 11-13, 1 (2006). Furthermore, changes in threshold voltage in an oxide semiconductor TFT by irradiating visual light and ultraviolet light is disclosed in Barquinha et al., J. Non-Cryst. Sol., 352, 1756 (2006).

SUMMARY OF THE INVENTION

However, in any of the above-described documents concerning oxide TFTs, methods for compensating or suppressing change in the threshold voltage due to the causes, and methods for relatively reducing the effects of change in the threshold voltage are not clarified.

Therefore, normally in the cases of conventional elements using an amorphous silicon semiconductor and apparatuses using the elements, the semiconductor channel layer is not directly operated on, but a circuit to correct the change in the threshold voltage is separately provided. By the correcting circuit, the apparatus can correctly operate even if change in threshold voltage occurs in the semiconductor. However, such a correcting circuit is a complicated circuit containing semiconductor element, and the separate provision of the correcting circuit enlarges and complicates the entire circuit and expands fabricating costs. Also when change in the threshold voltage is extremely large, it is difficult to correct the change in the threshold voltage only by the correcting circuit.

On the other hand, the threshold voltage can be changed by irradiating visible light and ultraviolet light on the oxide TFT. However, properties other than the threshold voltage, such as charge mobility and sub-threshold swing (S value) are changed as well. For example, the reduction of mobility at the same time of the lowering of the threshold voltage is reported in Barquinha et al., J. Non-Cryst. Sol., 352, 1756 (2006). Although it is preferable to maintain such properties to be equal to properties before the change, no methods enabling the maintenance of properties have been known.

Although it is not a problem derived from the back plane, in an organic electroluminescent display, decrease in luminescence intensity due to the deterioration of the organic electroluminescent element (or organic light-emitting diode/ OLED) has been known, causing a practical problem.

As described above, the threshold voltage of an oxide TFT changes due to various causes, and it is the present situation that the in-plane uniformity is insufficient depending on the uses and improvement by the circuit configuration.

To solve the above-described problems, it is an object of the present invention to provide a method for controlling the threshold voltage of a semiconductor element that can compensate or suppress change in the threshold voltage and the fluctuation of threshold voltages between the elements for stably operating an apparatus containing oxide TFTs.

The present invention is directed to a method for controlling the threshold voltage of a semiconductor element comprised of a semiconductor, comprising the steps of:

measuring a threshold voltage of the semiconductor element or a characteristic value serving as an index for the threshold voltage;

determining the irradiation intensity, irradiation time or wavelength of light with which the semiconductor is irradiated by the measured threshold voltage or characteristic value; and then irradiating the semiconductor with the light;

the light having a longer wavelength than a wavelength of an absorption edge of the semiconductor, and the threshold voltage being changed by the irradiation of the light.

The characteristic value can be a turn-on voltage of the semiconductor element.

The threshold voltage can be changed in a direction opposite to the changing direction of a threshold voltage of the semiconductor element changed first.

The semiconductor can be blocked from light having a shorter wavelength than the wavelength of the absorption edge of the semiconductor.

The semiconductor element can have at least a gate electrode, a source electrode, a drain electrode, a channel layer, and a gate insulating layer; the semiconductor being the channel layer.

The present invention is directed to a method for controlling the threshold voltage of a semiconductor element comprised of a semiconductor in a semiconductor device comprised of the semiconductor element and an electroluminescent element driven by the semiconductor element, comprising the steps of:

measuring a threshold voltage of the semiconductor element or a characteristic value serving as an index for the threshold voltage;

determining the irradiation intensity, irradiation time or wavelength of light with which the semiconductor is irradiated by the measured threshold voltage or characteristic value; and then irradiating the semiconductor with the light;

the light having a longer wavelength than a wavelength of an absorption edge of the semiconductor.

The characteristic value can be a turn-on voltage of the semiconductor element.

The characteristic value serving as the index of the threshold voltage can be one of the luminescence intensity and the penetrating electric current of the electroluminescent element.

The threshold voltage can be changed in a direction opposite to the changing direction of a threshold voltage of the semiconductor element changed first.

The semiconductor can be blocked from light having a shorter wavelength than the wavelength of the absorption edge of the semiconductor.

The semiconductor device can include a plurality of semiconductor elements; the semiconductor device is equipped with one light source for collectively irradiating light onto the plurality of semiconductor elements when the plurality of semiconductor elements are close to one another; and the threshold voltage of the plurality of semiconductor elements is simultaneously changed by the one light source.

The semiconductor device can include a plurality of light sources for irradiating the light, and the threshold voltages of a plurality of semiconductor elements are individually changed by the plurality of light sources.

The semiconductor element can have at least a gate electrode, a source electrode, a drain electrode, a channel layer, and a gate insulating layer; the semiconductor being the channel layer.

The semiconductor device can include a light emitting diode as a light source, and at least a TFT driver circuit, a Vth measuring circuit, a light emitting diode controlling circuit, and a memory as external circuits; and based on the time rate of change of the threshold voltage stored in the memory, one of irradiation intensity, irradiation time, and wavelength of the light irradiated onto the semiconductor is determined.

The semiconductor device can include a TFT array wherein the semiconductor elements are arranged in an array, a light emitting diode as a light source, and at least a gate driver, a source driver, a cathode driver, an anode driver, and a memory as external circuits; and based on the time rate of change of the threshold voltage stored in the memory, one of irradiation intensity, irradiation time, and wavelength of the light irradiated onto the semiconductor is determined.

The semiconductor device can include a reference element for measuring threshold voltage, and one of the threshold voltage of the reference element and a characteristic value that becomes the index for the threshold voltage in place of the semiconductor element is measured.

The semiconductor device can include a circuit that outputs a potential corresponding to the time integration value of the drain-source electric current of the semiconductor element in place of the circuit for measuring the Vth of the semiconductor element, and the potential obtained from the circuit that outputs the potential is used as the index for the threshold voltage.

In the semiconductor device the light emitting diode driver can be constituted by a constant voltage power source for driving the light emitting diode and a switch connected in series to the constant voltage power source; and the irradiation time of the light irradiated onto the semiconductor is determined without using a memory by providing a circuit that compares the reference potential Vref supplied from the exterior with the magnitude of the potential and holds the output, and connecting to the light emitting diode driver.

The surface density of the in-gap level of the semiconductor can be not higher than $10^{13}$ cm$^{-2}$ eV$^{-1}$.

The semiconductor can be a semiconductor having a band gap of not less than 1.55 eV.

The semiconductor can contain at least one element selected from In, Ga, Zn, and Sn.

According to the present invention, change in the threshold voltage can be compensated or suppressed in a semiconductor element wherein change in the threshold voltage caused by the history of fabricating process, change with time, electrical stress, thermal stress and the like occurs; and semiconductor device including the semiconductor element.

In addition, in a plurality of elements included in a semiconductor device, the fluctuation of threshold voltage between elements can be suppressed.

Furthermore, in a semiconductor device including an electroluminescent element, the lowering of luminescence intensity due to the deterioration of the electroluminescent element can be suppressed.

Further features of the present invention will become apparent from the following description of exemplary embodiments with reference to the attached drawings.

BRIEF DESCRIPTION OF THE DRAWINGS

FIG. 5 is a diagram illustrating change in threshold voltages of an example of semiconductor elements to which the present invention can be applied.

FIGS. 25A, 25B, 25C, and 25D are graphs illustrating a method for controlling a system according to the eighth embodiment.

FIG. 26 is a schematic diagram illustrating a semiconductor device according to the ninth embodiment.

BEST MODES FOR CARRYING OUT THE INVENTION

Figure 1:
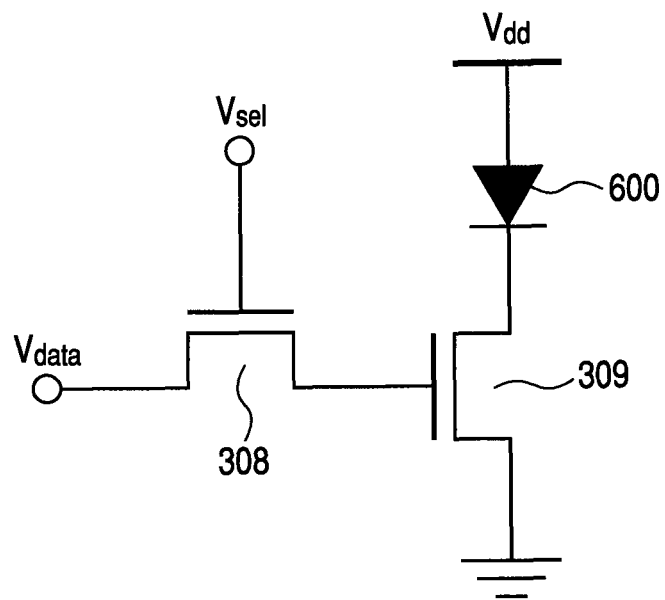
FIG. 1 is a circuit diagram illustrating an example of embodiments that can obtain the third effect of the present invention.

Hereafter, the embodiments of a method for controlling the threshold voltage of a semiconductor element according to the present invention will be described in detail referring the drawings.

The present invention is characterized in that the threshold voltage of a semiconductor element having a semiconductor at least as its component is controlled by the procedures including the following three steps.

Step (a): A step for measuring the threshold voltage of the semiconductor element Step (b): A step for determining one of the irradiation intensity, irradiation time, and wavelength of light that irradiates the semiconductor based on the measured threshold voltage Step (c): A step for irradiating light onto the semiconductor according to the determined conditions In the present invention, the semiconductor element means an element having at least a semiconductor as a component, which can define the threshold voltage. For example, a TFT fabricated using a semiconductor in a channel layer is included in the semiconductor element. The threshold voltage refers to a threshold voltage (Vth) obtained by ($\sqrt{\text{Ids}}$)–Vgs method (Ids: drain-source electric current, Vgs: gate-source voltage) and the like.

To put the present invention into practice, change in the threshold voltage of the semiconductor element by irradiating light having a longer wavelength than the absorption edge wavelength onto the semiconductor is required. The absorption edge wavelength means a wavelength of the lowest energy in light absorption based on interband transition of free carriers in the semiconductor. However, in the present invention, the absorption edge wavelength is what is defined as an x-intercept obtained by plotting $\sqrt{(\alpha h\nu)}$ relative to a photon energy $h\nu$ and extrapolating it on the x-axis as generally adopted in amorphous semiconductors. Here, h is the Planck constant (J·s), $\nu$ is the frequency (Hz) of photons, and $\alpha$ is the absorption coefficient ($cm^{-1}$).

Therefore, even in the light of the longer wavelength side than the wavelength of the absorption edge, there can be absorption by localized level including the in-gap level of the semiconductor bulk, the interfacial level, and the like.

To effectively put the present invention into practice, it is preferable to change the threshold voltage of the semiconductor element by a desired amount by adjusting the intensity of the light, the irradiating time, and the wavelength.

For example, an amorphous IGZO-TFT (a TFT using amorphous IGZO as the channel layer) is one of n-channel TFTs to which the present invention can be applied, and the threshold voltage thereof is lowered by light irradiation under specified conditions. The amount of change in the threshold voltage can be adjusted by selecting the conditions of light irradiation, such as irradiation intensity and time.

The first effect of the present invention is that change in the threshold voltage of a semiconductor element due to various causes, such as the history of fabricating process, change with time, electrical stress, and thermal stress can be compensated or suppressed. The "compensation" in the present invention means that the threshold voltage is changed to practically equal to the value before change due to the various causes. The "practically equal" in the present invention means that the following relation is satisfied when the amount of change in the threshold voltage generated due to the causes is compared with the amount of change in the threshold voltage by the irradiation of light in the present invention. Specifically, it can be said to be practically equal when no problems are caused by the difference for making the semiconductor element operate in a desired accuracy even if not only the amount of change is the same, but also there is difference in the value of change. Especially in the TFT for driving the OLED in an OLED display, even if the threshold voltage of the TFT is slightly changed by difference between the two quantities of change, the amount of change in the luminescence intensity of the OLED may be within a range wherein the tonal characteristics of the display are not affected. In addition, "suppression" in the present invention means that change in the threshold voltage with the reverse sign to and smaller than the change in the threshold voltage due to the causes is made to be generated by light irradiation, to partially negate the change in the threshold voltage due to the causes. In any of compensation and suppression, it is required that the change in the threshold voltage generated by light irradiation has the reverse sign against the direction (plus or minus) of the change in the threshold voltage due to the causes.

The case wherein the first effect of the present invention is best exerted is a case wherein the conditions of light irradiation are adjusted to compensate the change in the threshold voltage due to the causes. Thereby, the semiconductor element and the semiconductor device can be used without being affected by the change in the threshold voltage due to the causes.

On the other hand, the case wherein the conditions of light irradiation are adjusted to suppress the change in the threshold voltage of the semiconductor element due to the causes by light irradiation has also the first effect of the present invention. For example, the case wherein the life of a semiconductor element is defined as the time when the threshold voltage is continuously elevated or lowered to reach a constant value is considered. Even if the change in the threshold voltage of the semiconductor element due to the causes cannot be completely compensated, the life of the semiconductor element can be elongated by suppressing the former.

For example, in the case of the amorphous IGZO-TFT described above, the threshold voltage is elevated by the application of a gate voltage (electrical stress). Specifically, the sign of change in the threshold voltage due to light irradiation is reverse to the sign of change in the threshold voltage due to electrical stress. By applying the present invention to the amorphous IGZO-TFT, the effect of change in the threshold voltage due to electrical stress can be compensated or suppressed. As a result, the life of the TFT can be elongated.

The second effect of the present invention is that the fluctuation of threshold voltage between elements can be reduced in a semiconductor device including a plurality of semiconductor elements.

The third effect of the present invention is as follows: The system wherein a semiconductor device has a separate electroluminescent element other than a light source for irradiating light onto the semiconductor element in addition to the semiconductor element, and the electroluminescent element is driven by the semiconductor element is considered. When the present invention is applied to such a system, the effect wherein the lowering of the luminescence intensity due to the deterioration of the electroluminescent element can be compensated or suppressed can be obtained by actively changing the threshold voltage of the semiconductor element. Specifically, the present invention can be favorably applied to an active matrix OLED display and the like using the TFT as the semiconductor element for controlling the OLED. The embodiments for obtaining such an effect will be hereafter described in detail.

Next, the step (a), i.e. the measurement of the threshold voltage will be described in detail.

For the threshold voltage in the present invention, not only the threshold voltage (Vth) obtained by the ($\sqrt{Ids}$)–Vgs method, but also other indices may be used. For example, the turn-on voltage Von defined as follows can be used in a TFT. Specifically, in the Ids–Vgs characteristics in the TFT, Vgs wherein Ids exceeds a specific value Ids0 is expressed as Von. For example, in the TFT whose W/L ratio (the ratio of the channel width to the channel length) is about 1, if Ids0 is $10^{-11}$ A, Von is a value when Ids0 becomes $10^{-11}$ A. Hereafter, unless otherwise described, Von is the value obtained in the TFT of W/L=6 as Ids0=$10^{-1}$ A. Ids0 can be selected depending on the situation of the measurement of the W/L ratio and Von.

In Step (a), in place of any of the above-described indices (Vth, Von), other characteristic values determined by reflecting the threshold voltage of the semiconductor element may also be measured. In such a case, it can be considered that the measured characteristic value practically represent the threshold voltage, and the present invention can be applied by replacing the threshold voltage in the present invention with the characteristic value thereof. When the semiconductor element is a TFT, examples that can be adopted as the above-described indices are as follows:

Size of Ids in prescribed Vgs

Differentiation of Ids by Vgs in prescribed Vgs

Time integration (time integrated value) of Ids in prescribed period during the time when prescribed Vgs is applied (for example, the application of a pulse voltage)

Time integration (time integrated value) of Ids when Vgs is swept within a prescribed range (for example, the application of a triangle wave and the like)

The application example of the last characteristic value described above is shown in the seventh embodiment.

In the measurement of Step (a), in addition to the element that changes the threshold voltage (objective element), a reference element for measuring the threshold voltage may be used. In this case, it is preferable that the reference element is driven so that the threshold voltage of the reference element becomes the same as the threshold voltage of the objective element. Furthermore, it is preferable that the reference element is irradiated by the same light as the light for the objective element, and that the threshold voltage is changed corresponding to the change in the threshold voltage of the objective element. Practically, it is sufficient that the threshold voltage of the objective element can be estimated from the threshold voltage of the reference element, the driving state of the both elements and the light irradiation state may be not perfectly the same.

Next, the above-described Step (c), specifically, the step for irradiating light onto the semiconductor, will be described in detail.

There are the following two types of semiconductor elements to which the present invention can be applied. <1> A semiconductor element whose threshold voltage is changed compared with the threshold voltage before irradiation while the light having a longer wavelength than the absorption edge wavelength is irradiated onto the semiconductor. <2> A semiconductor element whose threshold voltage is changed compared with the threshold voltage before irradiation after the light having a longer wavelength than the absorption edge wavelength is irradiated onto the semiconductor.

The semiconductor element <1> is a semiconductor element wherein for example, fixed electric charge, such as carriers trapped in or in the vicinity of the semiconductor, is released by the light irradiation. The semiconductor element <2> is a semiconductor element wherein for example, carriers trapped in or in the vicinity of the semiconductor, are rearranged by light excitation, and reach an equilibrium state different from the state before irradiation.

When the threshold voltage is changed by light irradiation, it is preferable that electrical properties other than threshold voltage in the semiconductor element for facilitating driving the semiconductor element. When the semiconductor element is TFT, the properties other than threshold voltage include field-effect mobility and S value (sub-threshold slope).

During Step (c), it is preferable that the semiconductor is sufficiently shielded from the light having a shorter wavelength than the absorption edge wavelength. If the light having a shorter wavelength is irradiated, properties other than threshold voltage are also significantly changed. For example, in a semiconductor wherein the electron (hole) density or occupation of the in-gap levels are significantly changed due to the interband transition of carriers caused by light, the various properties of the semiconductor may be significantly changed by the irradiation of the light having a shorter wavelength than the absorption edge wavelength.

Also before Step (c), it is preferable that the semiconductor is sufficiently shielded from the light having a shorter wavelength than the absorption edge wavelength. Equivalent to the aforementioned case of the light having a long wavelength, even after blocking (shielding) the light having a short wavelength, the effect may be left in the semiconductor. When the emission spectra of the light source that irradiates light onto the semiconductor contain the light having the short wavelength, the above-described shielding is feasible, for example, by inserting a filter between the semiconductor element and the light source. Specifically, the filters of the absorption type (organic dye dispersed high-cut filter), the reflection type (dielectric multilayer mirror), and the scattering type can be used. Also a part of the semiconductor element, such as the channel protecting layer of the TFT, and the accompanying member, such as the substrate of the TFT formed on a plastic substrate may serve as a filter to absorb, reflect, and scatter the specific light toward the semiconductor. Although no adjustment of the spectra of the light from the light source is required if the light source does not emit the light having a short wavelength from the beginning, for example, by emitting a monochromatic light, the semiconductor itself is required to be shielded from the light having a short wavelength in the light from other than the light source, such as ambient light.

When the desired effect can be obtained, light irradiation can be intermittently repeated, or can be continuously performed.

The light source to irradiate the light onto the semiconductor may also be incorporated in the semiconductor device for implementing the present invention. In addition, even when the light source is independent from the semiconductor device, it is sufficient if the light source is optically coupled with the semiconductor element whose threshold voltage is to be changed (if the threshold voltage can be changed by irradiating light to at least a part of the semiconductor element).

If there are a plurality of elements whose threshold voltage is to be changed (objective elements), it is preferable that the same number of light sources are optically coupled with the semiconductor elements, and that the light emitting states of the light sources are determined independently from one another. Thereby, delicate control corresponding to independent semiconductor elements becomes feasible. On the other hand, if there are a plurality of elements whose threshold voltage is to be changed (objective elements) in the vicinity from one another, and the amount of change in the threshold voltage to be induced to the objective elements is the same degree to one another, a plurality of the objective elements may be optically coupled with a single light source. By doing so, the threshold voltage of a plurality of elements can be changed at once. Thereby, the number of the light sources can be reduced, and the configuration can be simplified.

Next, embodiments wherein the present invention is applied to an apparatus for driving an electroluminescent element will be described.

As one of the embodiments that can obtain the third effect of the present invention, an example wherein the present invention is applied to the TFT for driving the pixel circuit of an active matrix OLED display will be shown.

It is assumed that a switch TFT 308, a driving TFT 309, and an OLED 600 are connected in each pixel as shown in FIG. 1. To the OLED 600 and the driving TFT 309, a power source voltage Vdd (V) is applied. Vsel turns the switch TFT 308 to the ON state in the horizontal selecting period, and to the OFF state in other periods. Thereby, a potential Vdata is written in the gate voltage of the driving TFT 309, and the OLED emits light having an intensity corresponding to the amplitude of Vdata throughout the frame period. To the channel layer of the driving TFT 309, light can be radiated from a light source (not shown).

Figure 2:
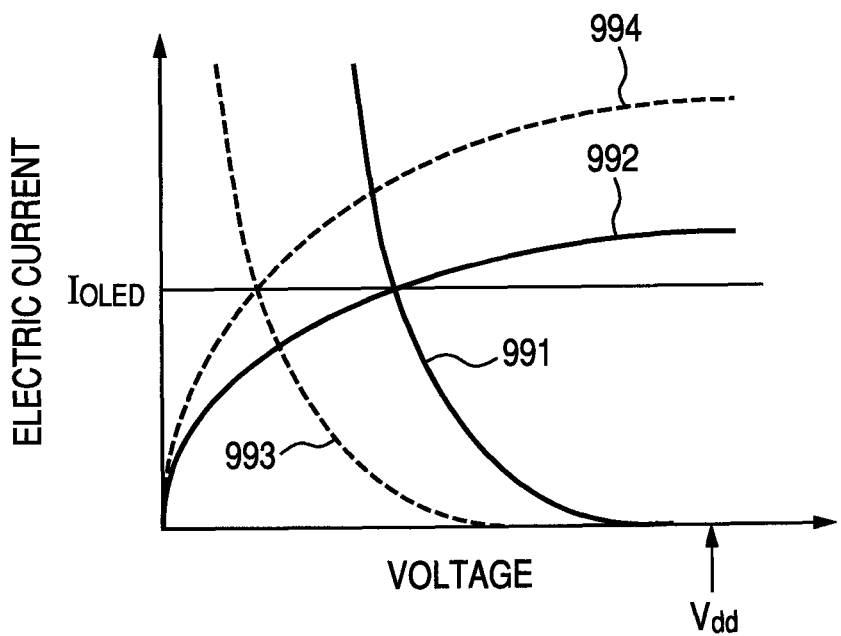
FIG. 2 is a graph illustrating operations when the present invention is applied to the circuit shown in FIG. 1.

Referring to FIG. 2, the operation when the present invention is applied to the circuit shown in FIG. 1 will be described. In FIG. 2, the referent numeral 991 indicates the electric current-voltage characteristics of the OLED 600 before OLED deterioration. The referent numeral 992 indicates the output characteristics of the driving TFT 309 before OLED deterioration. When the threshold voltage (Vth) of the driving TFT 309 before the deterioration of the OLED 600 is indicated as Vth0, the output characteristics of the driving TFT 309 are determined by the over-drive voltage Vgs–Vth. To make the OLED emit light in desired intensity, Vdata is given corresponding to the electric current (IOLED in FIG. 2) corresponding to the luminescence intensity. The over-drive voltage at this time is Vgs–Vth=Vdata–Vth0. The referent numeral 993 indicates the electric current-voltage characteristics of the OLED 600 after OLED deterioration. The referent numeral 994 indicates the output characteristics of the driving TFT 309 after applying the present invention to the driving TFT 309 to meet OLED deterioration to change Vth. By irradiating light onto the semiconductor, which is the channel layer of the driving TFT 309, the Vth of the driving TFT 309 is lowered by $\oplus \Delta$Vth|. The over-drive voltage Vgs–Vth becomes Vdata–Vth0+|$\Delta$Vth|, and the output characteristics of the driving TFT 309 change as the referent numeral 994 in FIG. 2. Even if Vdata is not changed depending on the deterioration of the OLED, |$\Delta$Vth| can be selected so as to emit light of the intensity practically equal to the intensity before the deterioration of the OLED.

Although the Vth of the driving TFT 309 may be measured to carry out such control, it is more preferable to directly measure the luminescence intensity of the OLED 600, and the value is used as the input value for controlling the threshold voltage of the driving TFT 309, because the accuracy of controlling is elevated.

When the electroluminescence efficiency for electric current is not significantly changed, the penetrating electric current of the electroluminescent element may be measured in place of the luminescence intensity of the electroluminescent element. In this case, the apparatus can be simplified compared with the case of measuring the luminescence intensity as described above.

In the control described above, it is not particularly required to equalize the Vth of the driving TFT 309 after light irradiation with the initial value Vth0. The Vth can be actively changed to maintain the luminescence intensity of the OLED 600 constant.

Although the perfect compensation against the lowering of the luminescence intensity of the OLED is described above, the effect of the present invention is exerted when the amount of change in the threshold voltage of the TFT by light is relatively small, and the deterioration of the OLED is not perfectly compensated. For example, the case wherein the life of a certain OLED display is defined as the time when the decrease in the luminescence intensity of the OLED reaches a constant value, is considered. Even if the decrease in the luminescence intensity is not perfectly compensated by light irradiation onto the TFT, the life of the OLED display can be elongated by suppressing the decrease in the luminescence intensity.

The electroluminescent element contained in the semiconductor device of the embodiments is not limited to the OLED as long as the luminescence intensity is controlled by the semiconductor element, and the deterioration of the electroluminescent element is advanced by driving (operation to emit light) and the luminescence intensity is gradually changed. For example, an inorganic electroluminescent element can be used.

Next, the semiconductor in the semiconductor element to which the present invention can be applied will be described.

The kind of the semiconductor is preferably a semiconductor wherein the areal density of the in-gap level is not more than $10^{13}$ cm$^{-2}$ eV$^{-1}$. In semiconductors having larger in-gap level densities, the excitation process of electrons (holes) from the in-gap level to the conduction band (valence band) cannot be ignored even by the irradiation of the photon energy sufficiently smaller (e.g. about half) than the band gap. Specifically, it is not preferable because the state similar to the state when the above-described light having a short wavelength is irradiated is produced even by the irradiation of light having a sufficiently longer wavelength than the absorption edge wavelength.

Furthermore, the band gap of the semiconductor is preferably at least 1.55 eV. The reason is that when the light source releases light having continuous spectrum, the choices of means for adjusting the spectra of light actually irradiated onto the semiconductor are widened. For example, if the photon energy corresponding to the absorption edge is present in the region of visible light (wavelength: not longer than 800 nm), a normal high-cut filter using absorption by organic dyes can be used. When such a filter is placed between the light source and the semiconductor, the state wherein light having a longer wavelength than the absorption edge wavelength of the semiconductor, while light having shorter wavelengths is not actually irradiated onto the semiconductor can be easily realized.

Furthermore, when the semiconductor is used in the channel layer of a TFT, the band gap of the semiconductor is more preferably not lower than 2 eV. This is because the channel leakage electric current in the OFF state of the TFT is considered to depend on the band gap of the semiconductor. Specifically, the channel leakage current Ioff (A) can be estimated by the following equation.

$$Ioff = q(ni(\mu e + \mu h)) \cdot (W/L) \cdot d \cdot Vds$$

where q is elementary charge; ni is intrinsic carrier density=$(NcNv)^{1/2} \cdot \exp(-Eg/2 kT)$ [Nc: the effective density of states in the conduction band; Nv: the effective density of states in the valence band; Eg: band gap; k: Boltzmann constant; T: absolute temperature]; $\mu e$ is the drift mobility of electrons; $\mu h$ is the drift mobility of holes; W is the channel width of the TFT; L is the channel length of the TFT; d is the thickness of the channel layer; and Vds is the drain-source voltage of the TFT.

By the above equation, the dependency of Ioff to Eg is estimated. When d is 20 nm, W/L is 4, and the material constant of single-crystalline silicon is used for all the material constants other than Eg, if Eg is larger than about 2 eV, Ioff can be suppressed to not higher than about $10^{-18}$ A. When the writing and holding of potential to the holding capacity (capacitance: 1 pF) are performed through the TFT, the variation by the channel leakage electric current of the written potential can be suppressed to not higher than 1 V even after $10^6$ s (=11.5 days). For example, when the TFT is used in the back plane pixel driver circuit of a display, the displayed contents can be considered to be effectively held for about several days.

Furthermore, since a wide gap semiconductor containing at least one of In, Ga, Zn, and Sn satisfies all of the above requirements, such a semiconductor is preferable. Specifically, in addition to an oxide semiconductor, such as In—Ga—Zn—O (IGZO), it is considered that the present invention can be implemented using a semiconductor having composition elements, such as In—Ga—As, In—Ga—Al—As, Ga—N, Zn—O, Zn—S, and Zn—Se.

It is also preferable that at least a part of the semiconductor is amorphous, because a semiconductor containing an amorphous portion excels in workability in etching and short-range uniformity more than a polycrystalline semiconductor.

As semiconductor materials that satisfy all of the above requirements, amorphous oxide semiconductors, such as amorphous In—Ga—Zn—O (IGZO), amorphous In—Zn—O (IZO), and amorphous Zn—Sn—O (ZTO) have been known. The present invention can be applied to semiconductor devices including semiconductor element using these materials.

Next, a method for fabricating an amorphous IGZO-TFT, which is one of semiconductor elements that can be used in a semiconductor device to which the present invention can be applied; and the electrical properties of a typical TFT will be shown, and change in the electrical properties by electrical stress and light irradiation.

<1> Fabrication and Evaluation of Semiconductor Thin Film

The properties of an amorphous IGZO film, which is a TFT channel layer, are evaluated as follows:

As a substrate on which films are formed, a degreased and cleaned glass substrate (Corning 1737) was prepared. As a target material, a polycrystalline sintered body having an InGaO$_3$ (ZnO) composition (diameter: 98 mm, thickness: 5 mm, electrical conductivity: 0.25 S·cm$^{-1}$) was used.

The total pressure in the deposition chamber during film formation was made to be 0.5 Pa by oxygen-argon mixed gas containing 5% oxygen by volume. The distance between the target and the substrate was 75 mm. Film formation was performed at the applied power of RF 200 W, and the film formation rate of 1.2 angstrom per second.

A laminated film of a thickness of 60 nm was observed by naked eye, and was transparent. The X-ray diffraction measurement, wherein X-rays were allowed to enter the laminated film of a thickness of 60 nm at the incident angle of 0.5 degree to the surface to be measured, was performed by the thin film method. Since no clear diffraction peaks were observed, the fabricated In—Ga—Zn—O film was determined to be amorphous. As a result of fluorescence X-ray analysis, the metal composition ratio of the thin film was In:Ga:Zn=1:0.9:0.6.

A current-voltage measurement was performed by the coplanar electrode pattern using a vapor deposited multi-player of titanium and gold, and the electric conductivity of the thin film was measured. The electric conductivity was about $1 \times 10^{-6}$ S·cm$^{-1}$. When the electron mobility is assumed to be about 5 cm$^2$·V$^{-1}$·s$^{-1}$, the electron carrier concentration is estimated as about $10^{12}$ cm$^{-3}$.

From the above, the fabricated thin film based on In—Ga—Zn—O contains In, Ga, and Zn; and it was confirmed that at least a part was an amorphous oxide semiconductor IGZO.

<2> Fabrication of TFT

Figure 3:
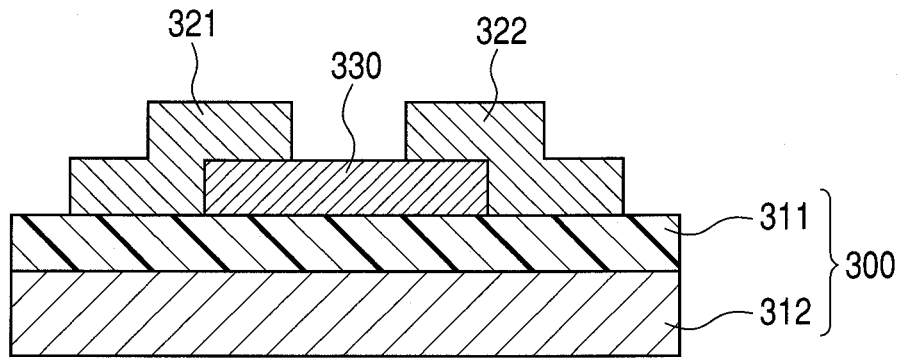
FIG. 3 is a sectional view illustrating an example of semiconductor elements to which the present invention can be applied.

A TFT is fabricated through the following procedures. FIG. 3 is a sectional view illustrating the TFT.

First, an n$^+$-silicon wafer (20 mm L×20 mm W×0.525 mm T) having a thermal silicon oxide film (thickness: 100 nm) was cleaned to be a substrate. On the substrate, an amorphous IGZO film, which is a semiconductor, was formed by RF magnetron sputtering (film-forming gas: O$_2$ (5% by volume)+Ar, film-forming pressure: 0.5 Pa, applied power: 200 W, film thickness: 20 nm). The temperature of the substrate was not particularly controlled during the film formation by sputtering. Then, the amorphous IGZO was patterned to a predetermined size by etching to be a channel layer. Next, the entire system was heated in an atmospheric ambient at 300° C. for 20 minutes. After forming and patterning a photoresist film thereon, titanium and gold films of the total thickness of 100 nm were formed by an electron beam vapor deposition method, and the resist film was lifted off to form a source electrode and a drain electrode.

By the above procedures, the conductive portion of the substrate was made to be a gate electrode 312, the thermal oxide film was made to be a gate insulating layer 311, and the amorphous IGZO was made to be a channel layer 330 to obtain a TFT 300 having a source electrode 321 and a drain electrode 322. The channel width W was 80 μm and the channel length L was 10 μm. When the transfer characteristics of the TFT were measured at a drain-source voltage Vds of +20 V, the TFT exerted clear n-channel characteristics. The threshold voltage (Vth) and the saturated mobility (μsat) obtained by the linear approximation of ($\sqrt{Ids}$)–Vgs property were 4.2 V and 13.1 $cm^2 \cdot V^{-1} \cdot s^{-1}$, respectively. The S value was 0.38 $V \cdot dec^{-1}$.

<3> Change in Threshold Voltage by Electrical Stress

Figure 4:
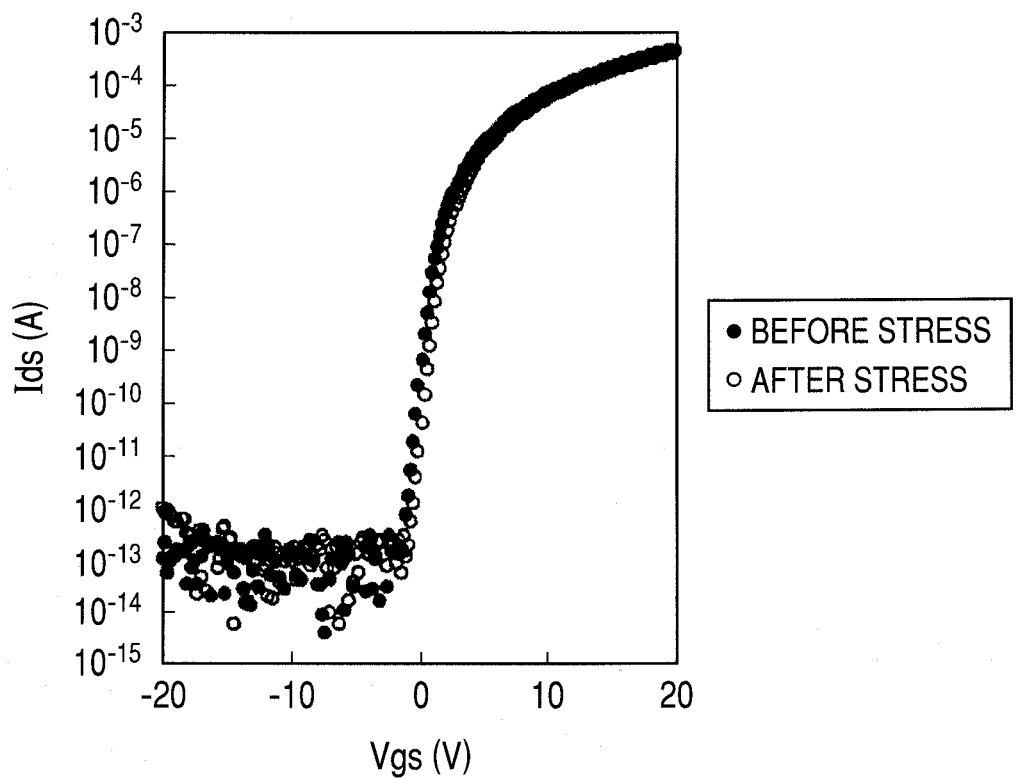
FIG. 4 is a graph illustrating the transfer characteristics of an example of semiconductor elements to which the present invention can be applied.
Figure 6A:
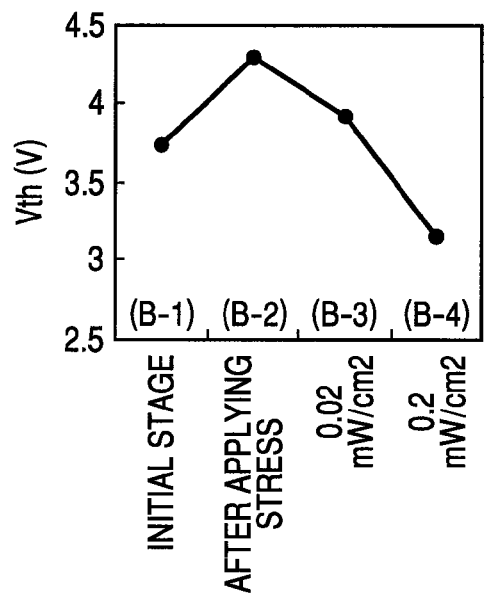
FIGS. 6A, 6B, 6C, and 6D are graphs illustrating change in properties of semiconductor elements in an example of semiconductor elements to which the present invention can be applied.
Figure 6B:
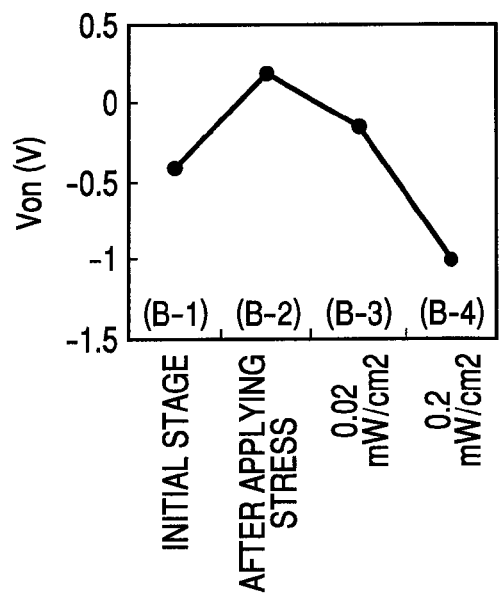
Figure 6C:
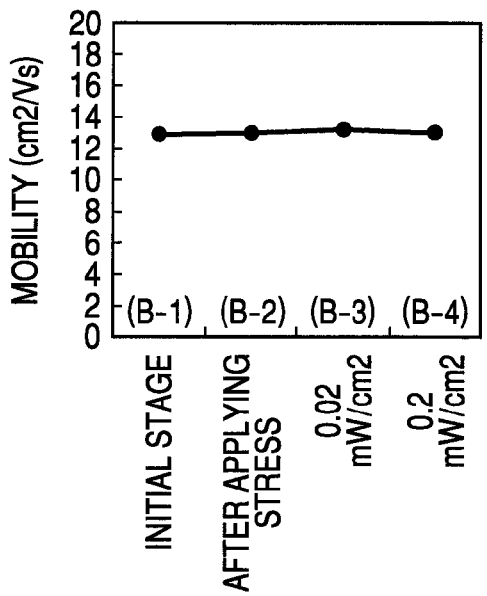
Figure 6D:
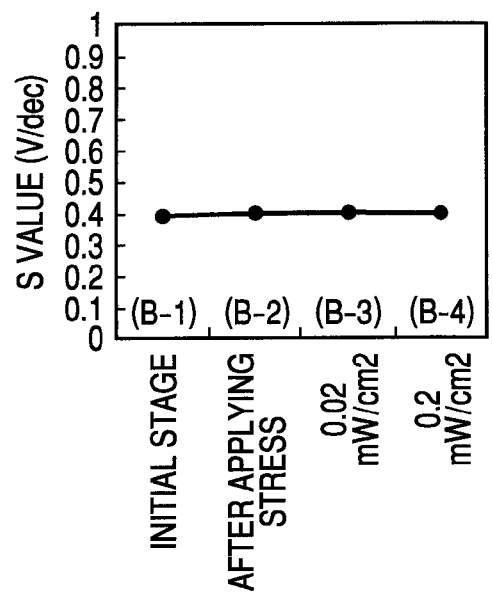

Change in the threshold voltage of the TFT by electrical stress is evaluated. As electrical stress, Vgs of +20 V and the drain-source voltage Vds of +0.1 V are applied for 1800 seconds. FIG. 4 illustrates transfer characteristics before and after applying the electrical stress. The TFT characteristics were as follows:

(Before applying stress) Vth=4.2 V, μsat=13.1 $cm^2 \cdot V^{-1} \cdot s^{-1}$, and S=0.38 $V \cdot dec^{-1}$ (After applying stress) Vth=4.8 V, μsat=13.1 $cm^2 \cdot V^{-1} \cdot s^{-1}$, and S=0.39 $V \cdot dec^{-1}$ Specifically, the Vth of the TFT is elevated by the application of a positive gate voltage. On the other hand, change in the μsat and the S value at this time is small.

<4> Adjustability of the Threshold Voltage of the TFT by Light Irradiation Intensity and Irradiation Wavelength 1

Four TFT samples similar to the TFT in <2> were fabricated, and the transfer characteristics of each of the samples were measured in a dark place at the Vds of +20 V. Next, the voltages, Vds of +0.1 V and Vgs of +20 V are applied to the TFTs, respectively, for 1800 seconds as electrical stress. During this time, a monochromatic light was irradiated for 1800 seconds under the following conditions being different depending on the TFTs:
(A-1) No light irradiation
(A-2) 400 nm, 0.02 $mW/cm^2$
(A-3) 400 nm, 0.2 $mW/cm^2$
(A-4) 600 nm, 0.2 $mW/cm^2$ Thereafter, light irradiation was stopped, and for each TFT, transfer characteristics were measured in a dark place at the Vds of +20 V.

Vth, Von, μsat, and S value were obtained from each of transfer characteristics measured before and after the application of electrical stress. Of these, ΔVth (V) and ΔVon (V), which are changes in Vth and Von by the stress, respectively, are illustrated in FIG. 5. In both cases, changes in μsat and S value from the initial values were less than 2% and less than 6%, respectively. Specifically, by irradiating the light having a wavelength of one of 400 nm and 600 nm onto the channel portion, only Vth and Von could be changed. Therefore, the light having a wavelength of one of 400 nm and 600 nm can be used when the present invention is applied to the apparatus containing the TFT. Moreover, by selecting the irradiation intensity and the irradiation wavelength, the amount of change caused by Vth and Von can be adjusted.

The same TFT was fabricated, and the same experiments were conducted under the light irradiation conditions of 320 nm and 0.2 $mW \cdot cm^{-2}$. Although not shown in the drawing, the threshold voltage much more changed compared with the case wherein the light having a wavelength of not less than 400 nm was used (ΔVth=–14.7 V, ΔVon=–18.0 V); however, the psat and the S value were increased from the initial values by 24% and 51%, respectively. Specifically, if the light having a wavelength of 320 nm is used when the present invention is applied to the apparatus containing the TFT, the response of the TFT to the driving voltage is changed, which is not preferable when the TFT is driven.

<5> Adjustability of the Threshold Voltage of the TFT by Light Irradiation Intensity and Irradiation Wavelength 2

As shown below, when light is irradiated onto the amorphous IGZO-TFT, the threshold voltage is changed compared with the threshold voltage before light irradiation even after light irradiation is stopped.

For one specimen of a similar TFT, transfer characteristics (B-1) to (B-4) were continuously measured by the following procedures:

a) Transfer characteristics (B-1) were measured in a dark place at the Vds of +20 V.

b) A voltage of Vds=+20 V and Vgs=+20 V was applied for 3,600 seconds as an electrical stress in a dark place.

c) In the same manner, transfer characteristics (B-2) were measured in a dark place.

d) Monochromatic light was irradiated under the conditions of 400 nm, 0.02 $mW \cdot cm^{-2}$, and 100 s.

e) Transfer characteristics (B-3) were measured in a dark place.

f) Monochromatic light was irradiated under the conditions of 400 nm, 0.2 $mW \cdot cm^{-2}$, and 100 s.

g) Transfer characteristics (B-4) were measured in a dark place.

FIGS. 6A to 6D illustrate Vth, Von, μsat, and S value obtained from each of the transfer characteristics.

Although both Vth and Von were increased by electrical stress, these could be lowered by light irradiation. At this time, the changes of the mobility and S value were less than 2% and less than 4%, respectively.

<6> Examination of the In-Gap Level Density of Amorphous IGZO

The wavelength dependency of change in the threshold voltage in the TFT was examined in further detail using the following method. The light from a xenon lamp was guided to a diffraction grating monochromator, and the monochromated light was irradiated onto the channel side of the TFT. The optical slit width of the monochromator was 24 nm. The density of the neutral density (ND) filter inserted in the light path was adjusted so that the irradiation intensity became 0.2 $mW \cdot cm^{-2}$ in each wavelength.

Figure 7:
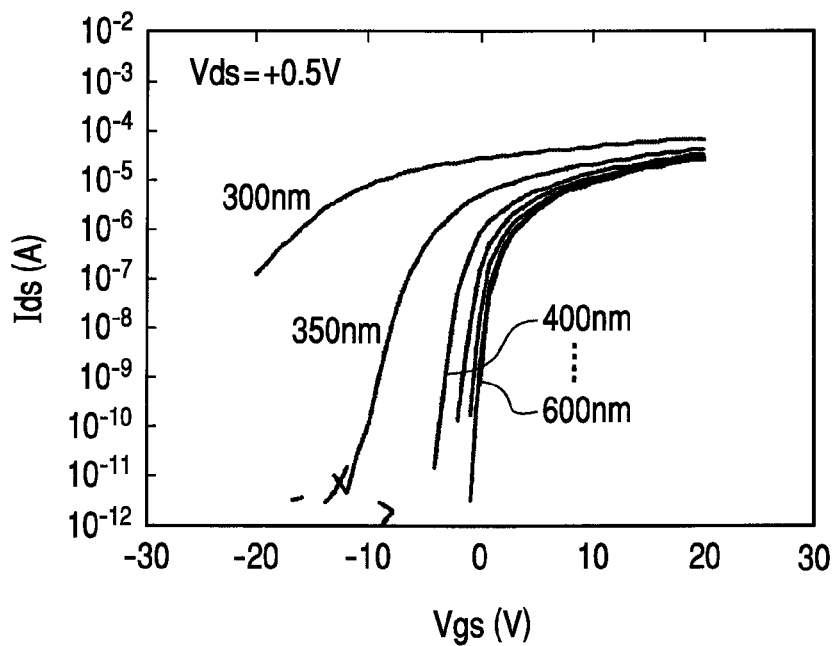
FIG. 7 is a graph illustrating change in transfer characteristics of an example of semiconductor elements to which the present invention can be applied.

The wavelength dependency of transfer characteristics was measured by the following procedures. First, after irradiating a monochromatic light having a wavelength of 600 nm onto the TFT for 100 seconds, the transfer characteristics when Vds is +0.5 V were measured while irradiating the light as it was. Next, after similarly irradiating a monochromatic light having a wavelength of 590 nm onto the TFT for 100 seconds, the transfer characteristics were similarly measured while irradiating the light. In the same manner, measurement was conducted while scanning the wavelengths for every 10 nm to the wavelength of 300 nm. The results are shown in FIG. 7.

For clarity, only transfer curves for every 50 nm of the irradiation light wavelengths, such as 600 nm, 550 nm, 500 nm, . . . are shown.

The transfer curves were simply moved in the negative direction of Vgs with the shortening of the wavelengths of the irradiated light. Since the shape of the transfer curves was little changed to the wavelengths of the irradiated light of 360 nm, it could be regarded that the transfer characteristics measured in a dark state were moved in parallel. In any of irradiation wavelengths, linear mobility μlin and S value were substantially equal to the values of the each in the dark state. On the other hand, in the shorter wavelength side, change in the shape of the curves was observed in addition to the movement of the transfer curve in the negative direction of Vgs. The μlin and S value were significantly changed compared with the dark state.

The parallel movement of the transfer curve in the longer wavelength side than 360 nm can be described as the negative fixed charge trapped by the in-gap levels distributed in or in the vicinity of the semiconductor is released. On the other hand, the mechanism of change in transfer characteristics observed in the shorter wavelengths than 360 nm has been unclear. It is imagined that the carrier density of the valence band and the conduction band and the occupancy of the in-gap level were greatly changed probably by the transfer of free carriers between bands caused by light.

Here, the areal density $\Delta Nt$ (cm$^{-2}$·eV$^{-1}$) of the in-gap levels related to the parallel movement of transfer characteristics was estimated as follows:

From FIG. 7, $\Delta Von$, which is the amount of change in Von, when the irradiation light wavelength λ is moved toward the shorter wavelength side by 10 nm, is obtained as the function of 360 nm≦λ≦600 nm. Each time when λ is changed by 10 nm, it is considered that the fixed charge, which was not released by excitation by the lower photon energy, was newly released, and Von was changed. The areal density $\Delta Nf$ (cm$^{-2}$) of newly released fixed charge can be expressed as follows using $\Delta Von$, the capacitance of the gate insulating layer Ci (F·cm$^{-2}$), and the elementary charge q (C) is expressed as follows:

$$\Delta Nf = Ci \cdot |\Delta Von|/q$$

When the correction regarding the increment $\Delta(h\nu)$ of the irradiated photon energy for every λ sweep step is considered, the areal density $\Delta Nt$ (cm$^{-2}$·eV$^{-1}$) related to the release of fixed charge is expressed as follows:

$$\Delta Nt = \Delta Nf/\Delta(h\nu) = \Delta Nf/\Delta(hc/\lambda)$$

where h is Planck's constant, and c is light velocity in a vacuum. (Although change in the number of irradiated photons is ignored, the error due to this is at maximum about twice at the both ends of the λ sweep range.)

Figure 8:
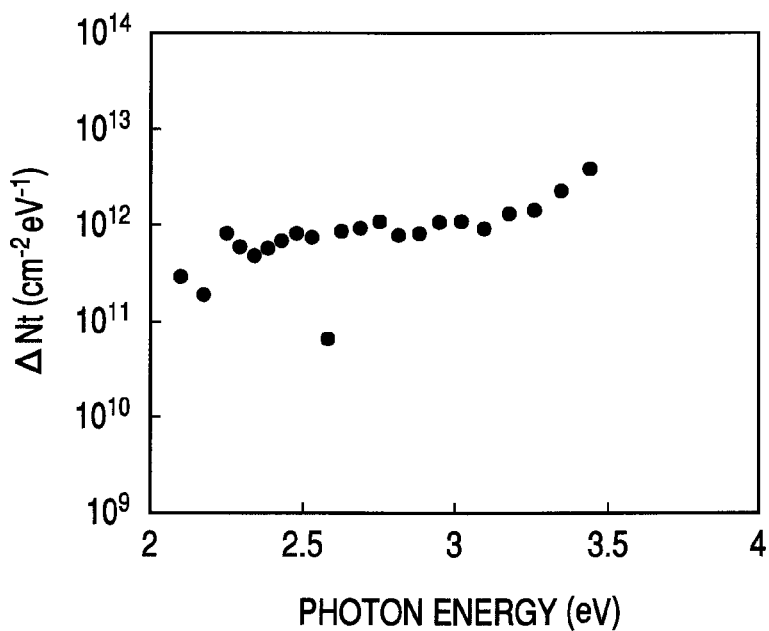
FIG. 8 is a graph illustrating the surface density of the in-gap level of an example of semiconductor elements to which the present invention can be applied.

FIG. 8 is a graph illustrating $\Delta Nt$ plotted against irradiated photon energy. This is considered to indicate the state density by reference to the energy EC, the bottom of the conduction band in the semiconductor.

By the analysis, it is estimated that $\Delta Nt$ (E) in the range from the energy E from EC-2 (eV) to EC-3.4 (eV) in the amorphous IGZO is not more than about 10$^{13}$ cm$^{-2}$·eV$^{-1}$.

Although the site where the in-gap level is present cannot be specified, when the in-gap levels are distributed in the semiconductor bulk, the in-gap levels are preferably evaluated by the volume density $\Delta Nt'$, (cm$^{-3}$·eV$^{-1}$). It is estimated by making the film thickness of the semiconductor film d (cm) as follows:

$$\Delta Nt' = \Delta Nt/d$$

Specifically, for the semiconductor film having the film thickness of 10 nm, $\Delta Nt = 10^{13}$ cm$^{-2}$·eV$^{-1}$ corresponds to $\Delta Nt' = 10^{19}$ cm$^{-3}$·eV$^{-1}$.

EMBODIMENTS

Although the embodiments of the present invention will be described hereunder, the present invention is not limited to the following embodiments.

First Embodiment

Figure 9:
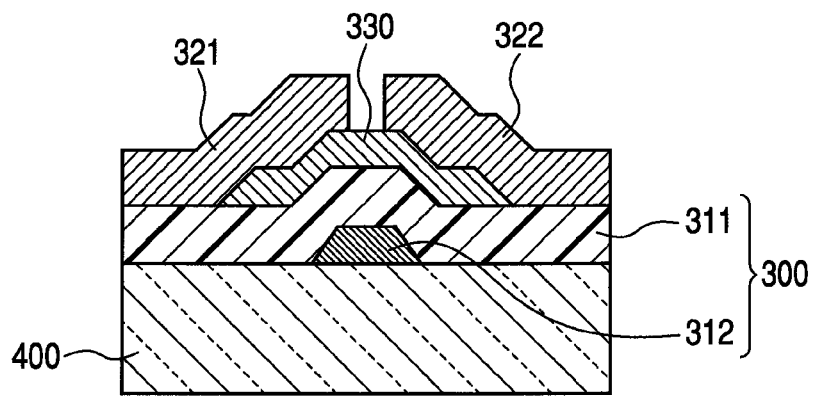
FIG. 9 is a sectional view illustrating a semiconductor element according to the first embodiment.

In the first embodiment, an amorphous GZO-TFT of a reverse stagger type was fabricated on a glass substrate through the following procedures. The sectional view of the TFT is shown in FIG. 9.

First, a glass substrate (Corning 1737) was cleaned, and was used as a substrate. On the substrate, a titanium-gold laminated film having a total thickness of 50 nm was laminated by an electron beam vapor deposition method, and the laminated film was patterned by a lift-off method to obtain the gate electrode 312. Thereon, a SiO$_2$ film having a thickness of 200 nm was laminated by an RF magnetron sputtering method (film forming gas: Ar, film forming pressure: 0.1 Pa, and applied power: 400 W) using SiO$_2$ as a target. This was patterned by etching to obtain the gate insulating layer 311. Thereon, an amorphous IGZO having a thickness of 20 nm was laminated by an RF magnetron sputtering method (film forming gas: O$_2$ (5% by volume)+Ar (95% by volume), film forming pressure: 0.5 Pa, and applied power: 200 W) using an In—Ga—Zn—O sintered body as a target. Then, the amorphous IGZO was patterned by etching to obtain the channel layer 330. The temperature of the substrate was not particularly controlled during sputtering. Thereafter, the entire system was heated in an atmospheric ambient at 300° C. for 20 minutes. After forming a photoresist film thereon and patterning, a titanium-gold laminated film having a total thickness of 100 nm was formed. The source electrode 321 and the drain electrode 322 were formed by lifting off the resist film to form the TFT 300. The channel width W was 80 μm, and the channel length L was 10 μm.

Figure 10:
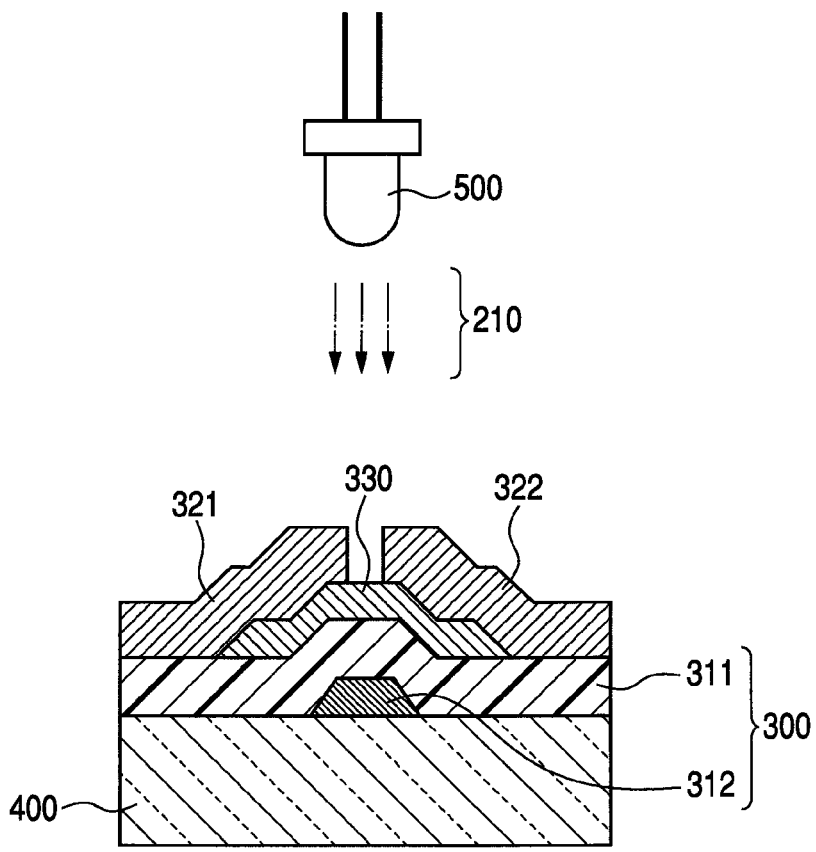
FIG. 10 is a schematic diagram illustrating a semiconductor device according to the first embodiment.

Furthermore, a semiconductor device on which a violet light emitting diode (active layer: SiC, center wavelength: 395 nm) was mounted so as to face the opening between the source electrode and the drain electrode (hereafter referred to as a channel portion) was fabricated. The schematic diagram of the apparatus is shown in FIG. 10. The channel portion of the TFT 300 faces the light emitting diode 500. By turning the light emitting diode 500 on, the light 210 generated by the light emitting diode is irradiated onto the channel portion of the TFT 300.

Figures 11, 12:
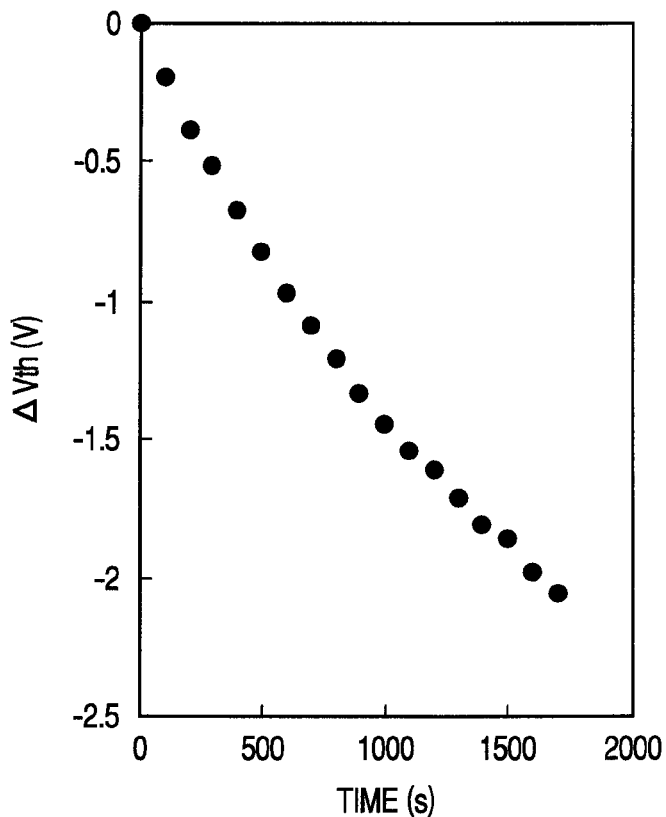
FIG. 11 is a table describing the characteristics of a semiconductor element according to the first embodiment.
FIG. 12 is a graph illustrating the calibration curve in the first embodiment.

The designed values for the TFT characteristics (Vth, psat, S value) in this apparatus are shown in (1-1) of FIG. 11.

When the apparatus was placed in a dark place and the transfer characteristics of the TFT were measured in the state wherein the light emitting diode was not turned on, the TFT characteristics were changed to the values shown in (1-2) of FIG. 11. Specifically, although psat and S value were close to the designed values, Vth was larger than the designed value. The difference in Vth is considered to be due to the defects (fabricating process history) in any of fabricating processes.

Based on this, the intensity of the light irradiated onto the channel portion of the TFT from the light emitting diode was determined as follows. First, for another apparatus fabricated by the same fabricating method as the method described above, the amount of change $\Delta Vth$ from the initial value of Vth had been previously obtained, and the calibration curve had been prepared. An example of the calibration line is shown in FIG. 12. In the irradiation conditions (monochromatic light having a wavelength of 395 nm, the intensity of 0.2 mW·cm$^{-2}$), it is known that as the irradiation time is elongated, the Vth of the TFT is lowered compared with the Vth compared with the value before the irradiation. Based on the calibration curve, the conditions for irradiation of the light onto the TFT were determined to be an intensity of 0.2 mW·cm$^{-2}$, and 600 seconds. Light was irradiated onto the TFT under these conditions, and light irradiation was stopped when the above time was elapsed.

Finally, the TFT characteristics were obtained again from the transfer characteristics of the TFT in the dark place. The results were as shown in (1-3) in FIG. 11.

As described above, in the semiconductor device containing the semiconductor element wherein change in threshold voltage is caused by the fabricating process history, the step for measuring the threshold voltage, the step for controlling the light irradiation conditions (irradiation intensity and irradiation time), and the step for irradiating light, change in the threshold voltage could be compensated.

Second Embodiment

Figure 13:
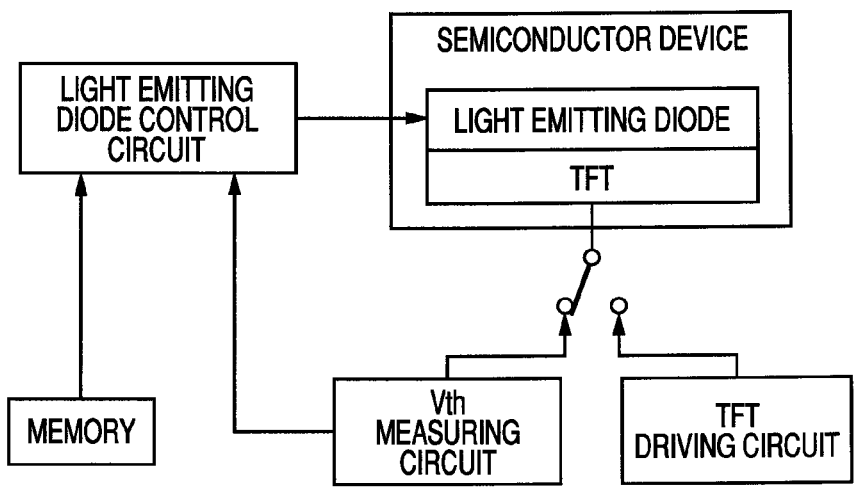
FIG. 13 is a schematic diagram illustrating a system including a semiconductor device according to the second embodiment.

In the second embodiment, the system wherein external circuits are added to the semiconductor device was established. The connections are schematically shown in FIG. 13.

A TFT driving circuit is connected to the TFT, and contains the power source and the like for making the TFT carry out the intended operations (such as the driving of loads (not shown) connected to the TFT). The Vth measuring circuit can be connected to the TFT optionally switching to the TFT driving circuit, and measures the Vth of the TFT and outputs the Vth to the light emitting diode control circuit. In the second embodiment, the Vth measuring circuit is made to have a variable voltage source and an electric current measuring device, and has a configuration for measuring the transfer characteristics of the TFT to calculate Vth and output the Vth to the light emitting diode control circuit. The memory stores the lookup table for specifying the electric current to be applied to the light emitting diode relative to the amount of change in Vth to be induced in the TFT. The light emitting diode control circuit contains a circuit controlling the ON and OFF of the light emitting diode, and a variable electric current power source for driving the light emitting diode.

The initial Vth of the TFT in the system is represented as Vth0. The system can be controlled by the following procedures. The procedures will be described referring to FIGS. 14A to 14C.

Figure 14A:
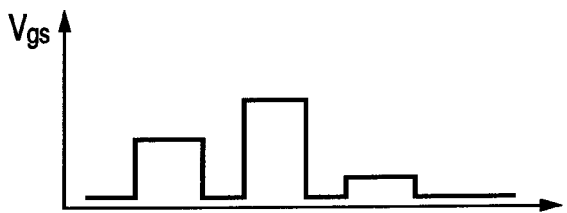
FIGS. 14A, 14B, and 14C are graphs illustrating a method for controlling the system in the second embodiment.

(1) First, a TFT driving circuit is connected to the TFT, and makes the TFT carry out a desired operation for a period t1 (sec) by the TFT driving circuit. In FIG. 14A, although a constant Vgs is applied between the gate and the source, it may have an optional driving wave form.

(2) Thereafter, the TFT driving circuit is disconnected from the TFT, and the Vth measuring circuit is connected to the TFT to measure Vth. The Vth has become Vth1=Vth0+ΔV1 by the electrical stress applied to the TFT by the TFT driving circuit, and has been shifted by ΔV1 (>0).

Figure 14B:
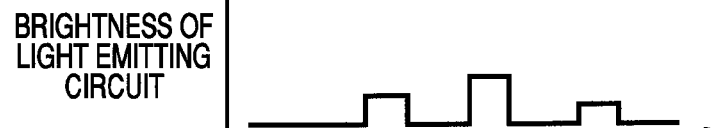

(3) The light emitting diode control circuit determines the intensity of the electric current applied to the light emitting diode referring to the memory based on the ΔV1, and turns the light emitting diode on in the predetermined brightness for the period t2 (sec) and thereafter turns it off. The brightness of the light emitting diode is as shown in FIG. 14B.

Figure 15:
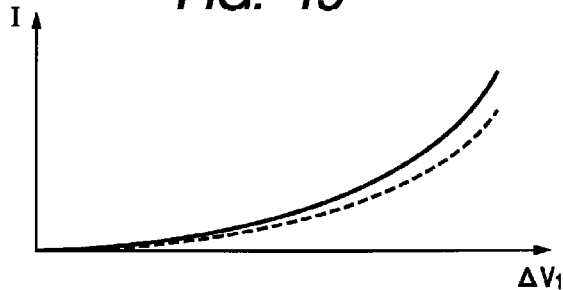
FIG. 15 is a graph illustrating a method for controlling the system in the second and third embodiments.

Here, the value stored in the memory is made to be an adequate value. Specifically, whatever amplitude of ΔV1 is generated in the procedure (1), the light emitting diode is made to be turned on in an adequate intensity so as to substantially compensate the change by the light irradiation during the period t2. By doing so, the Vth of the TFT after the period t2 can always be substantially equal to Vth0. To make such an operation feasible, the memory stores the applied electric current value I as shown by, for example, the solid line in FIG. 15 with respect to ΔV1.

Figure 14C:
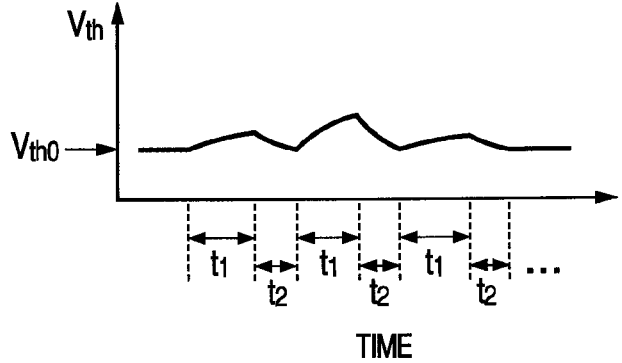

Thereafter, the operations of (1) to (3) can be repeated for optional number of times. The transition of Vth by such a control is shown in FIG. 14C. The amount of change in Vth depends on the driving state of the TFT by the procedure (1). Specifically, as the Vgs applied to the TFT in (1) is larger, ΔV1 is increased. However, over the long time, by optimizing the stored value of the memory, Vth can always be substantially equal to the initial value Vth0 as illustrated in FIG. 14C.

In the system, when the Vth of the TFT is changed due to causes other than electrical stress (thermal stress, change with time, and the like), equivalent control is feasible, and the Vth can be maintained in the vicinity of the initial value Vth0.

Specifically, even in a semiconductor device containing semiconductor elements that cause change in the threshold voltage by various causes (change with time, electrical stress, and thermal stress), change in the threshold voltage can be compensated.

Third Embodiment

In the third embodiment, change in the threshold voltage of a semiconductor element due to change with time was suppressed by light irradiation.

In a similar configuration as the second embodiment, a TFT is similarly driven to give the electrical stress of the same degree of the second embodiment. However, the stored value of the memory is as shown by the dotted line in FIG. 15, and the lighting-up brightness is lower than the brightness in the second embodiment for the protection of the light emitting diode. When the second embodiment is a system that can stabilize the Vth in the vicinity of the initial value Vth0, in the third embodiment, the Vth of the TFT is gradually elevated. However, in comparison to the case wherein the light emitting diode is not turned on, the increase of the Vth of the TFT due to the electrical stress can be delayed.

As described, in a semiconductor device containing a semiconductor element whose threshold voltage is changed due to various causes, change in the threshold voltage can be suppressed.

Fourth Embodiment

In the fourth embodiment, the amount of change of the threshold voltage was adjusted by the wavelength of the light radiated onto the semiconductor element.

Figure 16:
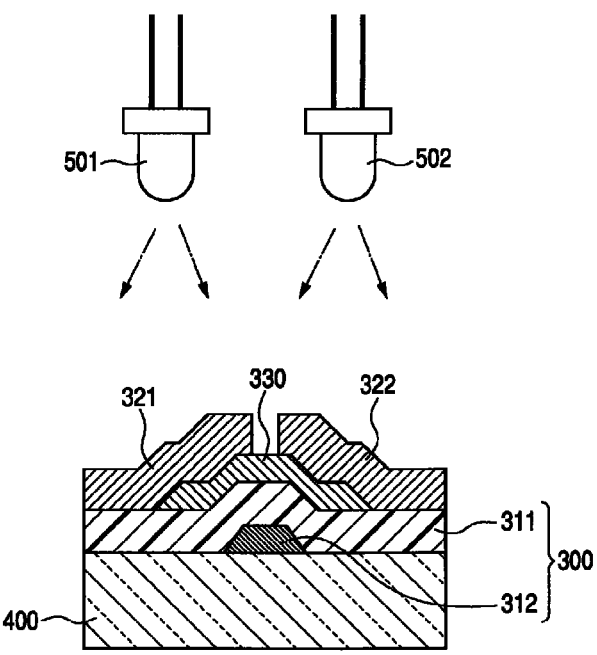
FIG. 16 is a schematic diagram illustrating a semiconductor device according to the fourth embodiment.

FIG. 16 is a schematic diagram illustrating a semiconductor device. First, an amorphous IGZO-TFT is fabricated by the method similar to the method according to the first embodiment. Furthermore, light emitting diodes 1 and 501 (active layer: SiC, center wavelength: 395 nm) and light emitting diodes 2 and 502 (active layer: AlGaInP, center wavelength: 600 nm) are mounted together so as to face the channel portion of the TFT 300 to be a semiconductor device. Other configuration is identical to the configuration of the first embodiment.

Figure 17:
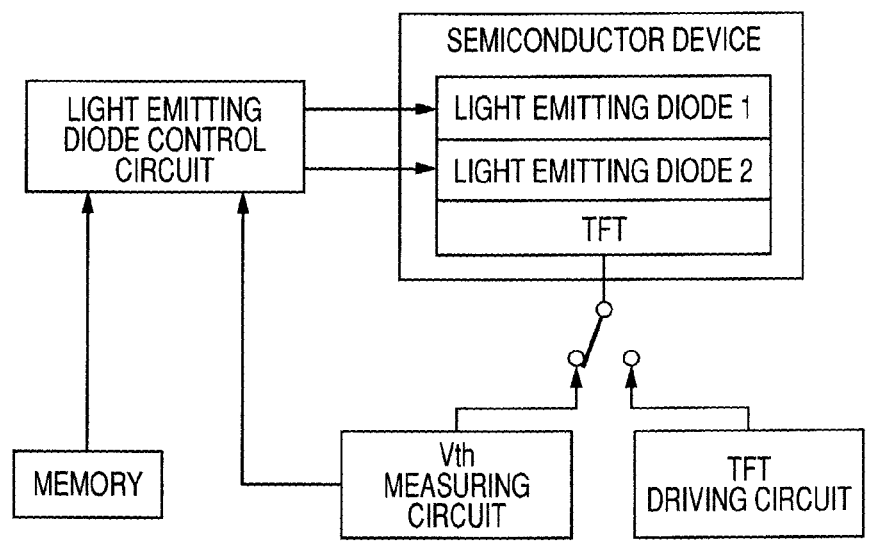
FIG. 17 is a schematic diagram illustrating a system including a semiconductor device according to the fourth embodiment.

The following external circuits are added to the semiconductor device and driven. The connections are schematically shown in FIG. 17. Similar to the second embodiment, a TFT driving circuit, a Vth measuring circuit, a memory, and a light emitting diode control circuit are included. However, the light emitting diode control circuit controls two light emitting diodes. The memory stores a lookup table that specifies the electric current to be applied to light emitting diodes 1 and 2 corresponding to the amount of change in Vth to be induced in the TFT 300. Specifically, when the amount of change in Vth to be induced in the TFT 300 is small, the light emitting diode 2 is mainly turned on, and when the amount of change in Vth to be induced in the TFT 300 is large, the light emitting diode 1 is mainly turned on. The system can be driven in the same manner as in the second embodiment, and the same effect as the effect of the second embodiment can be obtained.

Fifth Embodiment

In this embodiment, an exemplary apparatus including a reference element for measuring the threshold voltage was fabricated, in addition to an element whose threshold voltage is to be changed.

Figure 18:
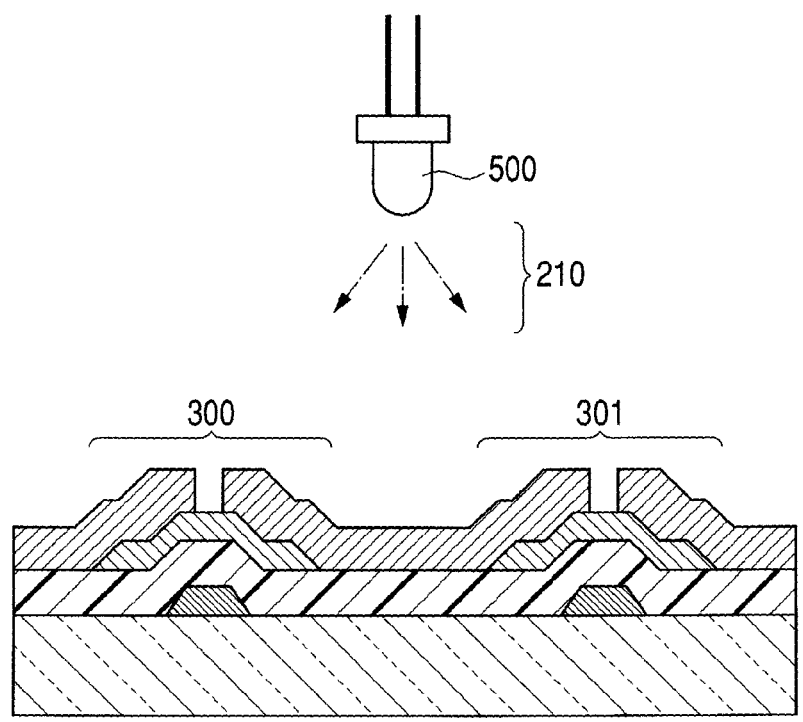
FIG. 18 is a schematic diagram illustrating a semiconductor device according to the fifth embodiment.

A semiconductor device as shown in FIG. 18 is fabricated. Here, the TFT 300 and a reference TFT 301 similar to the TFT 300 are arranged side by side. The reference TFT 301 is designed with the same size as the TFT 300. The TFT 300 and the reference TFT 301 are faced with a shared light emitting diode 500, and the same amount of light is incident upon the both TFTs from light 210 of the light emitting diode. Other features are the same as those of the semiconductor devices in the first embodiment.

Figure 19:
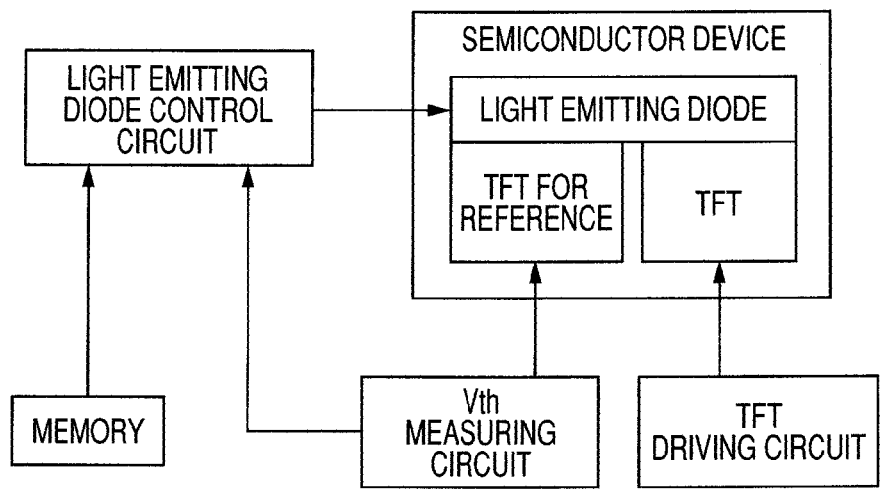
FIG. 19 is a schematic diagram illustrating a system including a semiconductor device according to the fifth embodiment.

External circuits are added to the device. The connection is conceptually shown in FIG. 19.

A TFT driving circuit is connected to the TFT 300, and includes a power source and other components to operate the TFT 300 as desired (e.g. driving a load which is not shown and is connected to the TFT 300). A Vth measuring circuit can measure Vth of the reference TFT 301 and output it to a light emitting diode control circuit. During the operation of the TFT driving circuit, the Vth measuring circuit can also apply, to the reference TFT 301, voltage or electric current equivalent to the voltage or electric current applied to the TFT 300 by the TFT driving circuit. A memory stores a lookup table specifying the electric current to be applied to the light emitting diode relative to the amount of change in Vth to be induced in the TFT in a specific time period. The light emitting diode control circuit is similar to that in the second embodiment.

Assuming that the initial Vth of the TFT 300 and that of the reference TFT 301 are the same in this system, and the Vth is referred to as Vth0. The light emitting diode 500 is controlled by the light emitting diode control circuit, and is turned on or off at a fixed brightness.

This system can be controlled as follows:

(1) The TFT 300 is operated as desired by the TFT driving circuit for a time period t1 (sec). The Vth of the TFT 300 varies from the initial value Vth0 depending on electrical stress caused by the TFT driving circuit and on the light 210 of the light emitting diode. On the other hand, the Vth measuring circuit always outputs a signal equivalent to that from the TFT driving circuit to operate the reference TFT 301 in a similar manner. It is conceivable that the Vth of the reference TFT 301 after the time period t1 may be equivalent to the Vth of the TFT 300.

(2) The Vth of the reference TFT 301 is measured by the Vth measuring circuit for a time period t2 (sec). Based on the time rate of change in the Vth of the reference TFT, the light emitting diode control circuit refers to the memory and changes the on state of the light emitting diode 500. During this time, the TFT driving circuit may be in any operation. For example, the TFT driving circuit may continue to be in the desired operation as similar to the procedure (1). When t1>>t2, the Vth of the reference TFT 301 may always substantially be the same as the Vth of the TFT 300.

Figure 20A:
FIGS. 20A, 20B, and 20C are graphs illustrating a method for controlling a system according to the fifth embodiment.
Figure 20B:
Figure 20C:
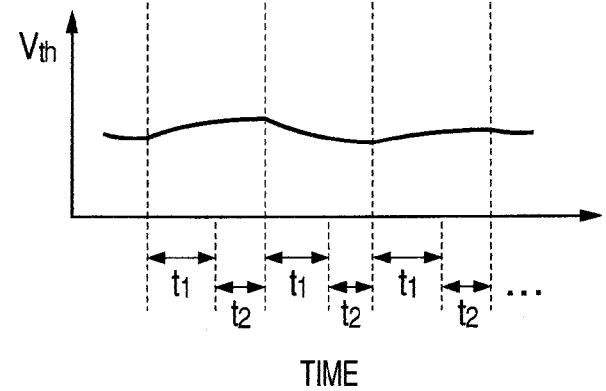

Thereafter, the operations (1) and (2) may be repeated in any number of times. FIGS. 20A to 20C show transitions of the gate-source voltage Vgs applied to the TFT 300, the brightness of the light emitting diode, and the Vth of the TFT 300 under the control. The amount of change in the Vth of the TFT 300 seen after the time period t1 depends on the difference between the brightness of the light 210 of the light emitting diode radiated before the time period t1 and electrical stress applied to the TFT during the time period t1. The Vth, however, is always substantially equivalent to the initial value Vth0 in a long term perspective.

Therefore, in a semiconductor device including a semiconductor element whose threshold voltage is changed due to electrical stress, the change in the threshold voltage can be compensated.

Comparing the embodiment to the second embodiment, the Vth of the TFT 300 can be determined without interrupting the desired operation carried out by the TFT 300 in this embodiment.

Sixth Embodiment

In this embodiment, a semiconductor device composed of a number of semiconductor devices shown in the second embodiment arranged in parallel is driven in a similar manner to the second embodiment.

Using a fabrication method as in the second embodiment, a TFT array having m rows and n columns of amorphous IGZO-TFTs arranged in an array is fabricated. Violet light emitting diodes (active layer: SiC, center wavelength: 395 nm) as many as the TFTs are arranged in an array on the TFT array in such a manner that each of the diodes is faced with each of the TFTs to form a light emitting diode array. The TFT array and the light emitting diode array constitute the semiconductor device. The relation between TFTs forming the array and corresponding light emitting diodes is similar to that shown in FIG. 10 in the first embodiment.

Figure 21:
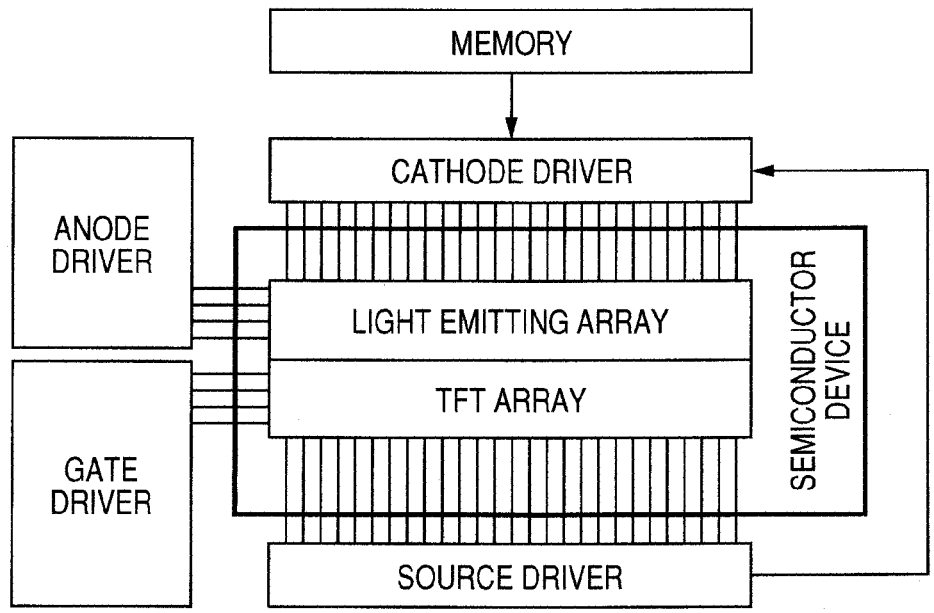
FIG. 21 is a schematic diagram illustrating a system including a semiconductor device according to the sixth embodiment.

The device is driven along with the following added external circuits. The connection is shown in FIG. 21.

Here, the memory is the same as in the second embodiment.

A gate driver having m stages and a source driver having n stages are used to drive the TFT array having m rows and n columns. These drivers have functions of the TFT driving circuit and the Vth measuring circuit as in the second embodiment, and select any of TFTs in the array to operate as the TFT driving circuit or Vth measuring circuit.

A cathode driver having m stages and an anode driver having n stages are used to drive the light emitting diode array having m rows and n columns. These drivers have functions of the light emitting diode control circuit as in the second embodiment. Based on Vth of each TFT measured by the m-stage gate driver and n-stage source driver, the corresponding light emitting diode in the array can be selected to control the on state with reference to the memory.

Figure 22:
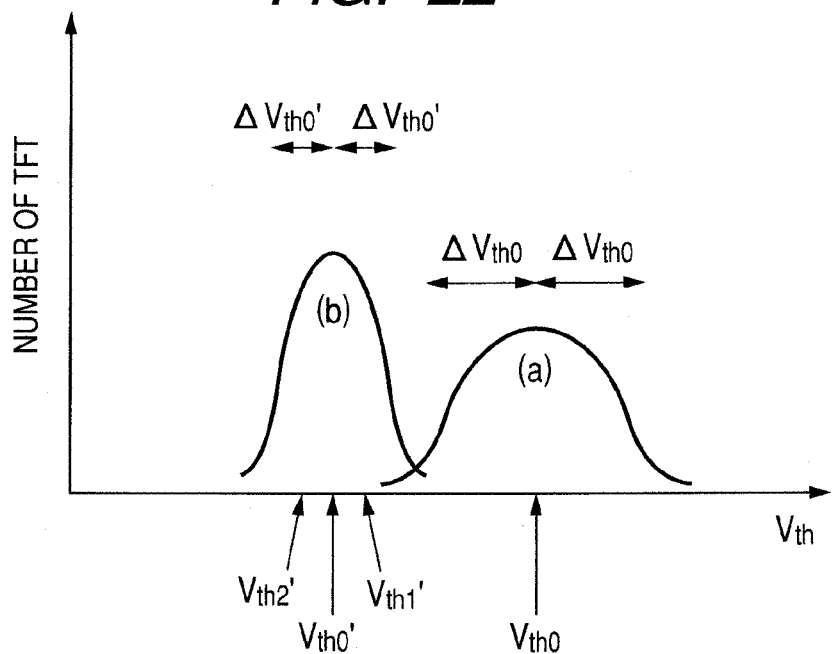
FIG. 22 is a graph illustrating the distribution of the threshold voltages of a semiconductor element according to the sixth embodiment.
Figure 23:
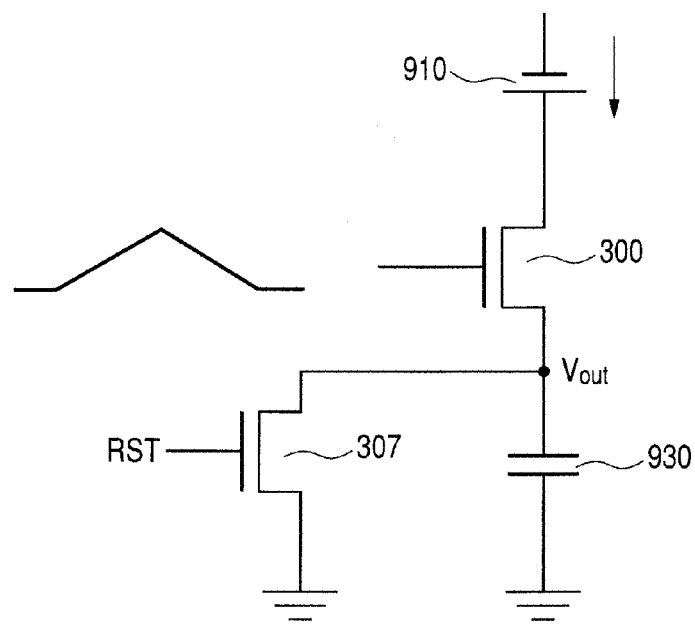
FIG. 23 is a circuit diagram in a part of a system according to the seventh embodiment.
Figure 24A:
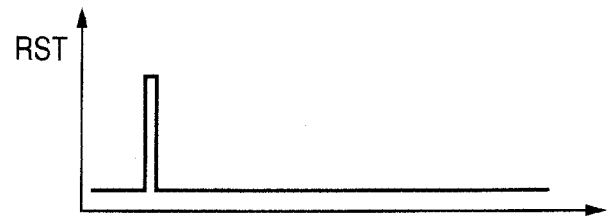
FIGS. 24A, 24B, and 24C are graphs illustrating a method for driving a part of a system according to the seventh embodiment.
Figure 24B:
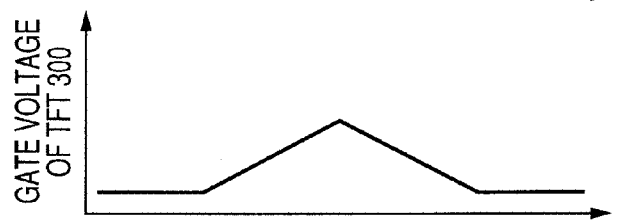
Figure 24C:
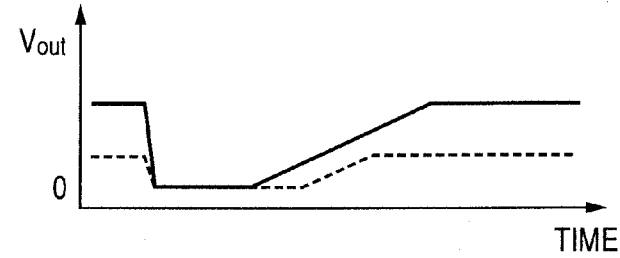

In the TFT array of this device, assume that due to in-plane non-uniformity of any one of fabricating processes of TFT array, threshold voltages (Vth) of the TFTs forming the array are distributed around the average value Vth0 (V) in the range of +/−ΔVth0 (V) as shown by (a) in FIG. 22.

This system is driven in a similar manner to the second embodiment. In a driving state of the array, assume that the threshold voltages (Vth) of the TFTs forming the array are distributed around the average value Vth0' (V) in the range of +/−ΔVth0' (V) as shown by (b) in FIG. 22. An average TFT representing Vth=Vth0' is also irradiated by light from the light emitting diode corresponding to the TFT, so that Vth0'<Vth0. Another TFT representing Vth=Vth1'>Vth0' is irradiated by more light than the average TFT is irradiated, so that the Vth of the TFT is closer to the average value (Vth0') as compared to the initial state. Similarly, still another TFT representing Vth=Vth2'<Vth0' is irradiated by less light than the average TFT is irradiated, so that the Vth of the TFT is also closer to the Vth0'. Therefore, it is considered that in a steady state, |ΔVth0'|<|ΔVth0|. This means that in the driving state of this system, the effect of the fluctuation of threshold voltages (Vth) due to the history of fabricating process is reduced.

In this way, in a plurality of elements included in a semiconductor device, the fluctuation of threshold voltage between elements can be suppressed.

Seventh Embodiment

The Vth measuring circuits shown in the above second to sixth embodiments can be substituted by a simpler circuit that can output information equivalent to Vth, instead of the Vth of TFT itself. FIGS. 23 and 24A to 24C show an embodiment of the circuit and drive timing charts of the circuit, respectively.

To determine Vth of the TFT 300, the TFT 300 is connected to a constant voltage power source 910 and a load capacity 930. The load capacity 930 is shunted by a reset TFT 307, and a reset signal RST input to the gate electrode of the reset TFT 307 resets the electric potential of Vout. The TFT 300 is turned off, the RST is input, and thereafter, the gate voltage of the TFT 300 is swept at a fixed rate within a fixed voltage range, and the TFT 300 is again turned off.

Depending on the magnitude of Vth of the TFT 300, the duration of on period of the TFT 300 varies, and the electric potential of Vout increases accordingly. It is conceivable that the magnitude of Vout is substantially proportional to the time integral of the drain-source current flown through the TFT 300 during the above operation. Specifically, when the Vth of the TFT 300 is small, the duration of on period of the TFT 300 is extended, and the Vout is large after the TFT 300 is turned off (in solid lines in FIGS. 24A to 24C). Contrarily, when the Vth of the TFT 300 is large, the Vout is small (in dashed lines in FIGS. 24A to 24C). Therefore, a circuit that outputs an electric potential of Vout can be used as a substitute for the Vth measuring circuit of the TFT 300. In the memory as in each of the above embodiments, a lookup table specifying the electric current to be applied to the light emitting diode according to the electric potential of the Vout may be stored.

In this way, a simpler circuit can be used to measure a signal equivalent to a threshold voltage. Thereby, in a semiconductor device including a semiconductor element, the change in the threshold voltage can be compensated or suppressed. In addition, in a plurality of elements included in a semiconductor device, the fluctuation of threshold voltage between elements can be suppressed.

Eighth Embodiment

According to this embodiment, in a combined embodiment of any of the second to sixth embodiments and seventh embodiment, the memory is omitted by providing a specific configuration to the light emitting diode control circuit.

Figure 25A:
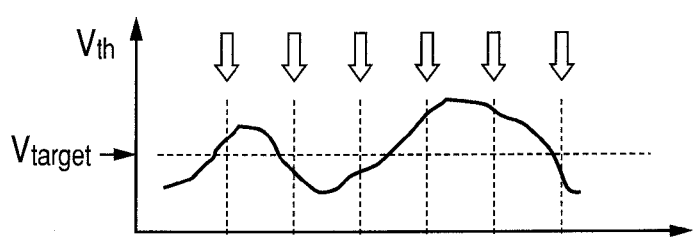
Figure 25B:
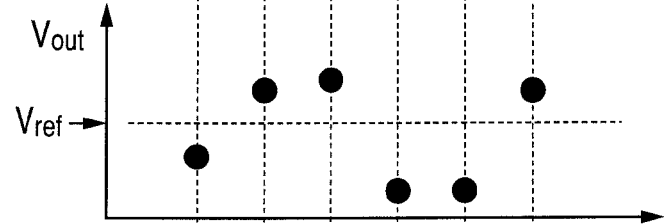

Using a circuit similar to the seventh embodiment, Vout of the TFT 300 is measured at the time shown by hollow arrows in FIG. 25A. When the Vth of the TFT 300 transitions as shown by a solid line in FIG. 25A, the output of a Vout output circuit is as shown by dots in FIG. 25B.

A comparator for comparing Vout with the reference potential Vref supplied from the exterior and a sample-and-hold circuit for holding the comparator output are used to form the input stage of (D) in the second to sixth embodiments. The comparator outputs a High potential when Vout<Vref, and a Low potential when Vout>Vref. The sample-and-hold circuit holds the output potential from the comparator until the next Vout signal is input. The output from the sample-and-hold circuit is as shown in FIG. 25C, with respect to the Vout and Vref in FIG. 25B.

A constant voltage power source for driving a light emitting diode and a switch connected in series with the power source are used to form the light emitting diode driver in the second to sixth embodiments. The switch is controlled by the sample-and-hold circuit, and the light emitting diode is kept in either of two values, on or off, until the next Vout signal is input. This means that on state is maintained when Vout<Vref, and off state is maintained when Vout>Vref. The brightness in on state is a constant value depending on the power source voltage. The on state of the light emitting diode is as shown in FIG. 25D, with respect to the Vout and Vref in FIG. 25B.

According to the above configuration, effective on-time of the light emitting diode is controlled depending on the magnitude of the Vth and Vref of the TFT 300, so that the Vth of the TFT 300 is stabilized near the desired voltage. That is, when Vout<Vref is achieved as the Vth of the TFT 300 increases, the light emitting diode is turned on. As the Vth decreases when the channel portion of the TFT 300 is irradiated by light, the Vout increases. When Vout>Vref is achieved, the light emitting diode is turned off. In this way, the Vth of the TFT 300 is stabilized near a Vth that achieves Vout=Vref.

The value of the Vref in the above operation can be a value of Vout obtained when the Vth of the TFT 300 achieves Vth=Vtarget (a control target value of the Vth of the TFT 300, shown in FIG. 25A). As a result, the Vth of the TFT 300 is stabilized near the Vtarget.

Ninth Embodiment

In this embodiment, instead of the threshold voltage of a semiconductor element, the luminescence intensity of an electroluminescent element is used as the amount of input for controlling the threshold voltage of the semiconductor element, when the present invention is applied to an apparatus for driving an electroluminescent element.

FIG. 26 shows a semiconductor device having a pixel circuit 999 of an active matrix OLED display and an OLED luminescence intensity reading circuit 998 of the pixel circuit 999, both arranged adjacently to each other. The pixel circuit 999 has a switch TFT 308, a driving TFT 309, and an OLED 600. The reading circuit 998 is arranged in proximity to the pixel circuit 999, and has a photodiode 800 and a reading capacitance 931. The reading circuit 998 may be provided with a reset TFT 307 for resetting the output potential Vout of the reading capacitance 931. A light emitting diode for radiating light onto the channel portion of the driving TFT 309, or the like, is omitted.

The light emitted from the OLED 600 is received by the photodiode 800 and is output as the electric potential Vout on the reading capacitance 931.

In this semiconductor device, by changing the Vth of the driving TFT 309 as described in the description of the embodiments, the lowering of luminescence intensity due to the deterioration of the OLED can be compensated or suppressed. Specifically, the conditions of light irradiation of the light emitting diode are controlled so as to always maintain the voltage difference (Vout−Vdata) to a specific value, thereby adjusting the Vth of the driving TFT 309.

In this way, in an electroluminescent element included in a semiconductor device, the lowering of luminescence intensity due to the deterioration of the electroluminescent element can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-124859, filed May 12, 2008, which is hereby incorporated by reference herein in its entirety.

The invention claimed is:

1. A method for controlling a threshold voltage of a semiconductor element comprised of a semiconductor in a semiconductor device comprised of the semiconductor element and an electroluminescent element driven by the semiconductor element, comprising the steps of:
    measuring a threshold voltage of the semiconductor element or a characteristic value serving as an index for the threshold voltage;
    determining an irradiation intensity, an irradiation time or a wavelength of light with which the semiconductor is irradiated by the measured threshold voltage or characteristic value; and
    irradiating the semiconductor with a light, the light having a longer wavelength than a wavelength of an absorption edge of the semiconductor,
    wherein the semiconductor device includes a plurality of semiconductor elements, the semiconductor device is equipped with one light source for collectively irradiating the light onto the plurality of semiconductor elements when the plurality of semiconductor elements are close to one another, and the threshold voltage of the plurality of semiconductor elements is simultaneously changed by the one light source.

2. The method for controlling the threshold voltage of a semiconductor element according to claim 1, characterized in that the semiconductor device includes a plurality of light sources for irradiating the light, and the threshold voltages of a plurality of semiconductor elements are individually changed by the plurality of light sources.

3. A method for controlling the threshold voltage of a semiconductor element comprised of a semiconductor in a semiconductor device comprised of the semiconductor element and an electroluminescent element driven by the semiconductor element, comprising the steps of:
    measuring a threshold voltage of the semiconductor element or a characteristic value serving as an index for the threshold voltage;
    determining the irradiation intensity, irradiation time or wavelength of light with which the semiconductor is irradiated by the measured threshold voltage or characteristic value; and
    irradiating the semiconductor with the light;
    the light having a longer wavelength than a wavelength of an absorption edge of the semiconductor,
    wherein the semiconductor element has at least a gate electrode, a source electrode, a drain electrode, a channel layer, and a gate insulating layer; the semiconductor being the channel layer, and
    wherein the semiconductor device includes a light emitting diode as the light source, and at least a TFT driver circuit, a Vth measuring circuit, a light emitting diode controlling circuit, and a memory as external circuits, and based on the time rate of change of the threshold voltage stored in the memory, one of irradiation intensity, irradiation time, and wavelength of the light irradiated onto the semiconductor is determined.

4. A method for controlling the threshold voltage of a semiconductor element comprised of a semiconductor in a semiconductor device comprised of the semiconductor element and an electroluminescent element driven by the semiconductor element, comprising the steps of:
    measuring a threshold voltage of the semiconductor element or a characteristic value serving as an index for the threshold voltage;
    determining the irradiation intensity, irradiation time or wavelength of light with which the semiconductor is irradiated by the measured threshold voltage or characteristic value; and
    irradiating the semiconductor with the light;
    the light having a longer wavelength than a wavelength of an absorption edge of the semiconductor,
    wherein the semiconductor element has at least a gate electrode, a source electrode, a drain electrode, a channel layer, and a gate insulating layer; the semiconductor being the channel layer,
    wherein the semiconductor device includes a TFT array, and
    wherein the semiconductor elements are arranged in an array, a light emitting diode as the light source, and at least a gate driver, a source driver, a cathode driver, an anode driver, and a memory as external circuits, and based on the time rate of change of the threshold voltage stored in the memory, one of irradiation intensity, irradiation time, and wavelength of the light irradiated onto the semiconductor is determined.

* * * * *